United States Patent
Doong et al.

(10) Patent No.: US 6,429,081 B1
(45) Date of Patent: Aug. 6, 2002

(54) PARASITIC SURFACE TRANSFER TRANSISTOR CELL (PASTT CELL) FOR BI-LEVEL AND MULTI-LEVEL NAND FLASH MEMORY

(75) Inventors: Kelvin Yin-Yuh Doong, Kaohsiung; Ching-Hsiang Hsu, Hsinchu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/858,530

(22) Filed: May 17, 2001

(51) Int. Cl.[7] .............................................. H01L 21/336
(52) U.S. Cl. ....................................... 438/301; 438/257
(58) Field of Search ................................. 438/211, 257, 438/263, 264, 267, 288, 301, 315, 574

(56) References Cited

U.S. PATENT DOCUMENTS

| | | |
|---|---|---|
| 6,023,085 A | 2/2000 | Fang ........................... 257/315 |
| 6,064,611 A | 5/2000 | Tanaka et al. ............... 365/203 |
| 6,122,193 A | 9/2000 | Shibata et al. ......... 365/185.03 |
| 6,153,469 A * | 11/2000 | Yun et al. |

* cited by examiner

Primary Examiner—David Nelms
Assistant Examiner—Phuc T. Dang
(74) Attorney, Agent, or Firm—George O. Saile; Stephen B. Ackerman; Rosemary L. S. Pike

(57) ABSTRACT

A new Flash memory cell device with a parasitic surface transfer transistor (PASTT) and a method of manufacture are achieved. The device comprises, first, a semiconductor substrate. The semiconductor substrate further comprises an active area and an isolation barrier region. A source junction is in the active area. A drain junction is in the active area. A cell channel is in the active area extending from the drain junction to the source junction. A parasitic channel is in the active area on the top surface of the semiconductor substrate extending from the drain junction to the source junction. The parasitic channel is bounded on one side by the isolation barrier region and on another side by the cell channel. A floating gate comprises a first conductive layer overlying the cell channel with a tunneling oxide layer therebetween. The floating gate does not overlie the parasitic channel. A control gate comprises a second conductive layer overlying the floating gate with an interlevel dielectric layer therebetween. A parasitic surface transfer-transistor (PASTT) gate comprises the second conductive layer overlying the parasitic channel with the interlevel dielectric layer therebetween.

20 Claims, 20 Drawing Sheets

PARASITIC SURFACE TRANSFER TRANSISTOR CELL (PASTT CELL) FOR BI-LEVEL AND MULTI-LEVEL NAND FLASH MEMORY

BACKGROUND OF THE INVENTION

(1) Field of the Invention

The invention relates to Flash memory cell devices, and more particularly, to a parasitic surface transfer transistor (PASTT) Flash memory cell for bi-level and multi-level NAND Flash memory structures and a method of manufacture thereof.

(2) Description of the Prior Art

As the blooming market of multi-media expands, high-density Flash memories are being applied to mass storage applications such as handy terminals, solid state cameras, and PC cards. Flash memories have many advantages, such as, fast access time, low power dissipation, and robustness. However, in order to gain greater market access, several requirements must be satisfied. First, the bit cost must be made lower. Bit cost is estimated at about $1.00 per megabyte by the 2000. Second, Flash memories must have high reliability. The target reliability, which is related to program/erase endurance and data retention, is a ten-year data retention time after one million program/erase cycles. Finally, high speed programmability, on the order of one microsecond per byte, and single 2.5 to 3.3 Volt power supply operation are emerging requirements.

Referring now to FIG. 1, a prior art EEPROM structure is illustrated. This Flash memory structure is a NAND configuration. A NAND configured EEPROM allows the individual cell size to be reduced without scaling the design or layout rules. The number of bit line contacts is reduced by connecting each Flash cell in series. In addition, such a prior art NAND-structure EEPROM would use a bi-polarity, Fowler-Nordheim tunneling program/erase method to achieve high reliability and high-speed programming.

In the example NAND structure, four Flash memory cells 46, 50, 54, and 58 are connected in series between the bit line 10 selection transistor, SLG1 42, and the source 14 selection transistor, SLG2 62. In the case of a bi-level memory system, the state of each cell in the array is either "0" or "1". To determine the particular state of an individual cell, the cell must be selected and tested. In the example case, the contents of the Flash cell 50 are read. To read the cell 50, the gate of the bit line selection transistor, SLG1 42, is biased to 5V and turned ON. The source selection transistor, SLG2 62, is likewise turned ON. The non-selected word lines, WORDLINE1 22, WORDLINE3 30, and WORDLINE4 34 are all biased to 5V and, therefore, turned ON. WORDLINE2 26 is then biased to a reading voltage, which is a voltage between the "1" state threshold voltage ($V_{th}$) and the "0" state threshold voltage. For example, if the "0" state (erased) threshold voltage of the Flash cell is -1 Volt and the "1" state (programmed) threshold voltage of the Flash cell is 2 Volts, then the reading voltage may be 0.5 Volts. If WORDLINE2 26 is biased to 0.5 Volts, then cell 50 will only conduct if it is in the "0" state. The cell 50 will not conduct if it is in the "1" state. Current flow or voltage discharge on the BITLINE-1 10 node can detect the state of the cell 50 based on this setup.

Referring now to FIG. 2, a graphical representation of the bi-level performance of the prior art NAND Flash structure is shown. The $V_{th}$ distribution of the bi-level programming scheme is illustrated. The "0" level state is defined as the erased state of a cell in which the $V_{th}$ level is controlled only by the inherent properties of the cell transistor without any floating gate charge storage. In this example, the Flash cells in the memory device exhibit a distribution 70 of "0" level voltage thresholds of between about -0.5 Volts and -3 Volts.

The "1" level state is defined as the programmed state for a cell in which the $V_{th}$ value is modified by the presence of negative charge on the floating gate. In this example, the Flash cells in the memory device exhibit a distribution 74 of "1" level voltage thresholds of between about 0.5 Volts and 3.5 Volts covering a range $R_{21}$. As described above, during a reading operation, the unselected cells in the bit-line series of the cell being read must be turn ON. The unselected cells must be driven with a gate voltage 78 that is greater than the highest "1" level voltage threshold so that all the unselected cells are guaranteed to be in the ON state during a read. Note that a wide "1" level range $R_{21}$ is desirable for insuring easy and fast programming of the cell. However, a wide range makes it difficult to insure that all unselected cells will be ON during reads to the selected cell. It is desirable to maintain a wide $R_{21}$ value while providing a maximum separation of the "1" level distribution 74 and the unselected gate voltage distribution 78.

It has been found that the cost per bit of Flash memory devices can be significantly reduced through the use of multi-level schemes in which more than two levels are encoded onto the threshold voltages of the cells. For example, a four-level scheme, wherein "0", "1", "2", and "3" are encoded into a sequence of escalating threshold voltage values, has been shown to reduce the required area for a fixed memory size by about 60%. In such a system, the programming technique allows the amount of floating gate charging to be controlled such that discrete $V_{th}$ values are attained for each level state. The "0" state remains the erased or inherent $V_{th}$ state.

Referring now to FIG. 3, the $V_{th}$ distribution for a four-level NAND EEPROM scheme is illustrated. Again, the "0" level reflects the non-charged state of a cell and exhibits a fairly wide distribution 82 below 0 Volts. However, the "1" level distribution 86 must be much narrower than in the bi-level system so that the additional "2" and "3" levels can be included.

Note that the "1", "2", and "3" levels are narrowly distributed 86, 90, and 94 and have tight ranges of $R_1$, $R_2$, and $R_3$, respectively. For example, each range $R_1$, $R_2$, and $R_3$ is about 0.6 Volts. Further, the levels are closely spaced with spacings $S_1$ and $S_2$ of about 0.8 Volts. Finally, the "3" level 94 must be spaced $S_3$ from the unselected gate voltage distribution 100 by about 0.6 Volts to insure correct operation. It is essential that the entire range of levels "1", "2", and "3" be encoded in less than about 4 Volts to insure proper operation during cell reads and, particularly, to insure that the unselected cell voltage of about 5 Volts will turn ON the highest "3" level cells. This very tight spacing and distribution scheme causes cell programming to be very slow. This is because the programmed cells must be verified within these tight level windows. In addition, data retention failures are greater because of these narrow level ranges.

To avoid the problems caused by the four-level scheme while achieving the advantage of smaller area, a side-wall transfer-transistor cell (SWATT) multi-level NAND Flash EEPROM has been developed. This technique provides low $V_{th}$ transistors in parallel with each Flash cell. These low $V_{th}$ transistors are guaranteed to turn ON at the unselected gate voltage regardless of the programmed state of their cell. This means that a wider voltage distribution can be designed for the "1", "2", and "3" levels. Programming speed and data retention are improved while achieving a small cell size of about 0.67 microns² for a 0.35 micron design rule. However, as will be seen in the following analyze, the SWATT Flash cell scheme has several disadvantages.

Referring now to FIG. 4, a cross-section of a partially completed SWATT Flash memory device is shown. At this stage of the processing sequence, a stack comprising a tunneling oxide layer 124, a polysilicon layer 128, and a cap oxide layer 132 has been deposited overlying the semiconductor substrate 120. The stack 124, 128, and 132 has been patterned to define the floating gates for the Flash cells. Trenches 140 for shallow trench isolations (STI) have been etched into the semiconductor substrate 120. Finally, a trench oxide filling layer 136 has been deposited.

Referring now to FIG. 5, the trench oxide filling layer 136 is etched back to complete the STI 136. The cap oxide layer 132 is removed during the etch back process. The trench oxide filling layer 136 is etched back to reveal a portion of the trench side-walls 144 where the transfer-transistors will be formed. A boron ion implantation 146 is then performed to adjust the $V_{th}$ of the planned side-wall transfer-transistors. Note that the boron ion implantation 146 must be performed using an angled implantation to effectively implant the semiconductor substrate 120 in the region where the side-wall transfer-transistors are planned 144.

Referring now to FIG. 6, an ONO layer 148 and a second polysilicon layer 152 are deposited. The control gate over the floating gate of each cell is thus created. In addition, the transfer-transistor gates 164 are formed comprising the second polysilicon layer 152 overlying the exposed semiconductor substrate 120 on the side-walls of the trenches 164 with the ONO layer 148 therebetween.

As discussed above, the presence of the side-wall transfer-transistors provides a significant advantage for the Flash cells so constructed. However, there are several significant disadvantages to the SWATT device and process method used to fabricate it. It is important that the threshold voltage ($V_{th}$) of the side-wall transfer-transistor be carefully controlled. The dominant parameters determining the $V_{th}$ of the SWATT devices are the boron concentration in the trench side-wall area, the thickness of the ONO layer 148 in the SWATT area, and the channel width of the SWATT cell.

While the boron concentration can be carefully controlled, the ONO thickness and channel width cannot be so carefully controlled. For example, the ONO thickness will be affected by the first oxide layer thickness in the ONO stack 148. This first oxide layer thickness depends upon the crystal orientation of the top corner of the STI trench and is strongly dependent upon the slope of the trench. This means that the $V_{th}$ of the SWATT cell will be controlled by the STI module process, including the trench etching, trench oxide etch back, and liner oxidation processes. The STI module processes are not designed to achieve such precise control. Further, the $V_{th}$ will be determined by the channel width of the SWATT cell. The dominant factor in this parameter is the trench oxide filling layer 136 etch back process. It is difficult to control the etch back process and, therefore, the channel width of the SWATT cell will vary significantly.

Several prior art inventions describe NAND-type Flash EEPROM memories, devices, and process methods. U.S. Pat. No. 6,023,085 to Fang discloses a method of forming a NAND-type Flash memory device. The core region of the integrated circuit contains memory cells and selection transistors. The periphery region contains low and high voltage transistors. The method teaches a technique to form select transistors having thicker gate oxide than the tunneling oxide used in the memory cells. The selection transistors may or may not comprise the stacked gate used in the memory cells. U.S. Pat. No. 6,064,611 to Tanaka et al teaches a NAND-type Flash memory device. The read circuit includes a means of pre-charging the bit-line through a transistor. During read sensing, this transistor is turned OFF. A multi-level NAND memory block is illustrated. U.S. Pat. No. 6,122,193 to Shibata et al discloses a data latch circuit that facilitates encoding data from binary to four-level for storage in a four-level memory.

SUMMARY OF THE INVENTION

A principal object of the present invention is to provide an effective and very manufacturable Flash EEPROM memory device.

A further object of the present invention is to spread the NAND Flash multi-level voltage thresholds across a wider voltage range to thereby improve programming speed and data retention.

Another yet further object of the present invention is to allow faster programming by reducing the number of program/verify cycles.

Another yet further object of the present invention is to achieve a small layout area and a low per bit cost.

Another yet further object of the present invention is to integrate the parasitic surface transfer-transistors into the manufacturing process such that good control of the transfer-transistor voltage threshold is achieved.

In accordance with the objects of this invention, a new Flash memory cell device with a parasitic surface transfer transistor (PASTT) is achieved. The device comprises, first, a semiconductor substrate. The semiconductor substrate further comprises an active area and an isolation barrier region. A source junction is in the active area. A drain junction is in the active area. A cell channel is in the active area extending from the drain junction to the source junction. A parasitic channel is in the active area on the top surface of the semiconductor substrate extending from the drain junction to the source junction. The parasitic channel is bounded on one side by the isolation barrier region and on another side by the cell channel. A floating gate comprises a first conductive layer overlying the cell channel with a tunneling oxide layer therebetween. The floating gate does not overlie the parasitic channel. A control gate comprises a second conductive layer overlying the floating gate with an interlevel dielectric layer therebetween. A parasitic surface transfer-transistor (PASTT) gate comprises the second conductive layer overlying the parasitic channel with the interlevel dielectric layer therebetween. The PASTT gate inverts the parasitic channel to turn ON the PASTT device at a parasitic threshold voltage.

Also in accordance with the objects of this invention, a new method to form a Flash memory device with Flash memory cells and parasitic surface transfer transistors (PASTT) in the manufacture of an integrated circuit device is achieved. A tunneling oxide layer is deposited overlying a semiconductor substrate. A first conductive layer is deposited overlying the tunneling oxide layer. The first conductive layer and the tunneling oxide layer are patterned to define the cell width edges of floating gates for planned Flash memory cells and to expose the semiconductor substrate where shallow trench isolations are planned. Temporary sidewall spacers are formed on the cell width edges of the first conductive layer. The exposed semiconductor substrate is etched to form trenches for the planned shallow trench isolations. A trench filling oxide layer is deposited overlying the first conductive layer and the temporary sidewall spacers and filling the trenches. The trench filling oxide layer is polished down to complete the shallow trench isolations and to thereby define active areas in the semiconductor substrate. The temporary sidewall spacers are removed to thereby expose the active areas between the shallow trench isolations and the cell width edges of the first conductive layer. The exposed active areas form parasitic channels and the unexposed active areas form cell channels. The semiconductor substrate is ion implanted to thereby adjust the threshold voltages of the Flash memory cells and the PASTT devices. An interlevel dielectric layer is deposited overlying the first conductive layer and the parasitic channels. A second conductive layer is deposited overlying the interlevel dielectric layer. Parasitic transistor gates are formed where the second conductive layer overlies the parasitic channels with the interlevel dielectric layer therebetween. The second conductive layer, the interlevel dielectric layer, the first conductive layer, and the tunneling oxide are patterned to thereby form control gates and to define the cell length edges of the floating gates for the Flash memory cells. Floating gates are formed where the first conductive layer overlies the cell channels with the tunneling oxide layer therebetween. Control gates are formed where the second conductive layer overlies the floating gates with the interlevel dielectric layer therebetween. Ions are implanted into the semiconductor substrate to form source and drain junctions to complete the Flash memory cells and the PASTT devices said in the manufacture of the Flash memory device.

BRIEF DESCRIPTION OF THE DRAWINGS

In the accompanying drawings forming a material part of this description, there is shown:

FIGS. 8a through 21b illustrate in cross section the cell array of the preferred embodiment Flash memory of the present invention. Figures with suffix "a", such as FIG. 11a, present cross section A—A of FIG. 10 at a step of the preferred process method. Figures with suffix "b", such as FIG. 11b, present cross section B—B of FIG. 10 at a step of the preferred process method. Figures with the same number, such as FIGS. 11a and 11b, present cross sections A—A and B—B, respectively, at the same process step.

DESCRIPTION OF THE PREFERRED EMBODIMENTS

The preferred embodiment discloses a Flash memory device, comprising a Flash EEPROM cell with a parasitic surface transfer-transistor (PASTT) device, of the present invention. A preferred embodiment method of manufacturing this Flash EEPROM device is disclosed. It should be clear to those experienced in the art that the present invention can be applied and extended without deviating from the scope of the present invention.

Figure 7:
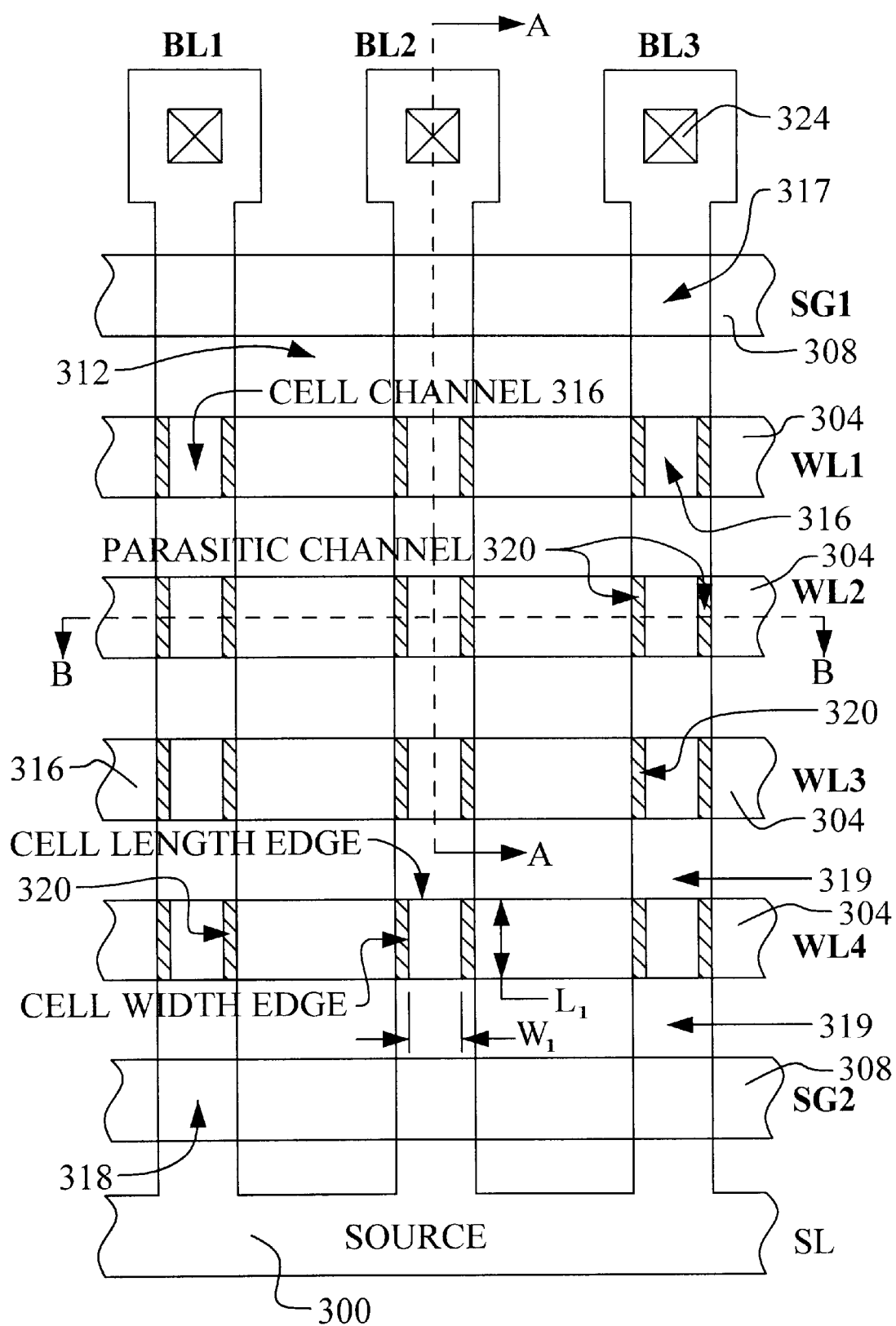
FIG. 7 illustrates a top view of a portion of a cell array in the preferred embodiment Flash memory of the present invention.

Referring now particularly to FIG. 7, a preferred embodiment of a Flash EEPROM device of the present invention is shown. The layout top view of a portion of the Flash memory device is shown. Several important features of the present invention are depicted.

The layout depicts bit-lines, BL1, BL2, and BL3, running in parallel with each other. The bit-lines are formed as an active area 300 that terminate in a common source, SOURCE or SL. The word-lines, WL1, WL2, WL3, and WL4, are routed in parallel with each other and perpendicular to the bit-lines, BL1, BL2, and BL3. The word-lines comprise a conductive layer 304, such as polysilicon. Selection lines, SG1 and SG2, are routed above and below the array of word-lines. The selection lines comprise a conductive layer 308. A 3×4 cell array is depicted. In practice, much larger arrays of PASTT Flash cells would be used.

The manufacturing method of the present invention is implemented such that floating gates are formed between the overlying conductive layer 304 word-lines, such as WL1, and the underlying active area 300 bit-lines, such as BL3. Therefore, the intersections of the word-lines and the bit-lines form Flash transistor cells 316. For example, the intersection of BL3 and WL1 forms a Flash cell 316. In addition, the intersection of the conductive layer 308 selection lines, such as SG1, and the active area 300 bit-lines, such as BL3, creates selection transistors 317.

The form of the layout of the preferred embodiment creates a NAND-type Flash cell array. In this array, the Flash cells 316 are connected in series with a bit-line selection transistor 317 above and a source line selection transistor 318 below. The bit-lines, BL1, BL2, and BL3 may contain contact openings 324 to connect to a metal interconnect layer, not shown. However, significant layout space is saved by not requiring any contact openings at each individual cell in the bit-line series.

An important feature of the preferred embodiment of the present invention is shown as the parasitic channels 320. As will be discussed below, the novel fabrication method of the present invention allows the active area 300 at the intersection with the word-lines 304 to be partitioned into two types of transistor channel regions, a parasitic channel 320 and a cell channel 316. In a conventional process, the entire active area 300 under the word-lines 304 would comprise the cell channel region. That is, the entire active area 300 at the intersection of the word-lines 304 would be covered with tunneling oxide and the floating gate electrode. Therefore, the entire intersection constitutes a Flash cell channel that is inverted whenever the word-line voltage exceeds the threshold voltage ($V_{th}$) for that cell.

In the novel process method of the present invention, however, a part of the active area 300 at the word-line 304 intersection is formed into a parasitic channel 320. The word-line conductor 304 overlies this parasitic channel 320, with a dielectric layer, not shown, therebetween. A parasitic surface transfer-transistor (PASTT) is thereby formed. This PASTT device 320 turns ON whenever the word-line 304 voltage exceeds the voltage threshold ($V_{th}$) necessary to invert the parasitic channel 320. The remaining part of the active area 300 at the intersection with the word-line 304 forms the Flash cell channel 316 as in the conventional process.

Note that each Flash cell has three active area portions, a center cell channel 316 and two adjacent parasitic channels 320. The cell channel 316 and the parasitic channels 320 extend across the source/drain junctions 319 of the bit-line active area 300 in the lengthwise direction. Note that each Flash cell channel 316 has a length $L_1$ and a width $W_1$. The edges defining the length $L_1$ dimension are labeled as CELL LENGTH EDGE. The widthwise direction of the cell channel 316 is bordered by the parasitic channels 320. The edges defining the width $W_1$ dimension of the cell channel 316 are labeled as CELL WIDTH EDGE. Finally, note that the layout top view of the present invention is sectioned at A—A and B—B. Section A—A will illustrate the Flash cells in the bit-line or lengthwise direction. The B—B section will illustrate the Flash cells in the widthwise of wordline direction and will particularly illustrate the novel PASTT device and the method of fabrication thereof.

Figure 8A:
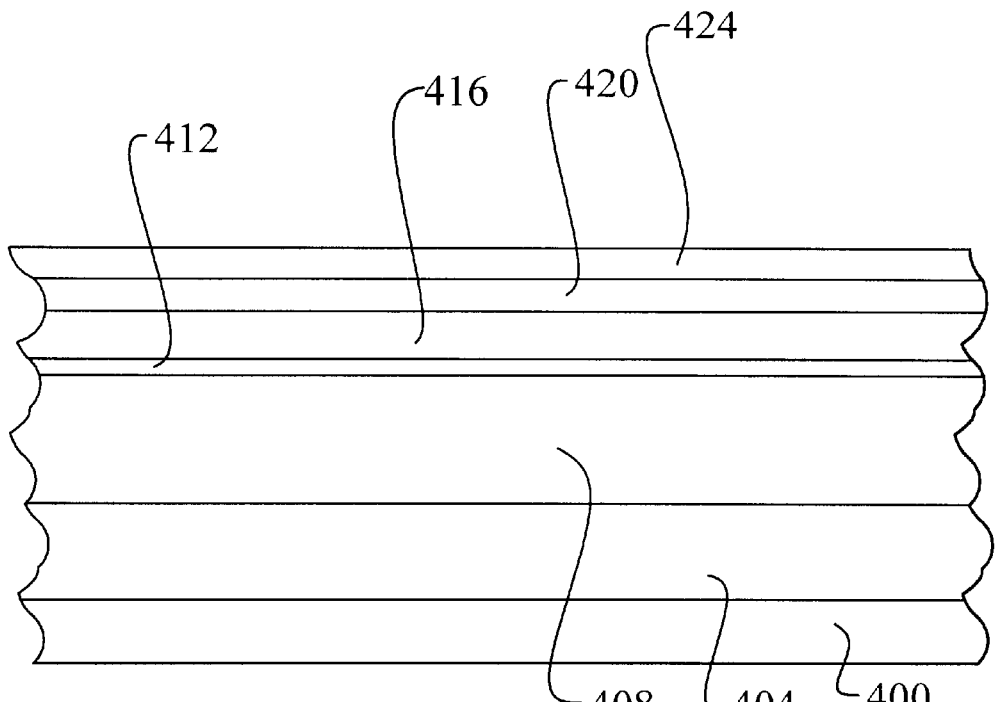

Referring now to FIG. 8a, the preferred embodiment of the method of fabrication of the present invention will be discussed in detail. FIG. 8a illustrates cross section A—A of FIG. 7 at an early stage of the method. A semiconductor substrate 400 is provided. The semiconductor substrate 400 preferably comprises monocrystalline silicon that is lightly p-type. In the preferred embodiment, a deep n-well 404 and a p-well 408 are formed in the semiconductor substrate 400. The deep n-well 404 and p-well 408 may be formed, for example, by thermal diffusion or by ion implantation followed by thermal drive-in. To simplify the description, the term semiconductor substrate 400 will hereon refer to the combination of the 400, 404, and 408 layers.

A tunneling oxide layer 412 is deposited overlying the semiconductor substrate 400. The tunneling oxide layer 412 is preferably grown by thermal oxidation. Alternatively, the tunneling oxide layer 412 may be deposited by a chemical vapor deposition (CVD) process. The tunneling oxide layer 412 is preferably deposited to a thickness of between about 55 Angstroms and 120 Angstroms. A first conductive layer 416 is deposited overlying the tunneling oxide layer 412. The first conductive layer 416 will subsequently form the floating gates for the planned Flash cells. The first conductive layer 416 preferably comprises polysilicon that is deposited by CVD or by low-pressure CVD (LP-CVD) to a thickness of between about 80 Angstroms and 1,500 Angstroms.

It is important to note that the tunneling oxide layer 412 and the first conductive layer 416 are deposited prior to the formation of isolation barrier regions in the semiconductor substrate. This approach is contrary to the practice in conventional Flash EEPROM processes. By depositing the tunneling oxide layer 412 and the first conductive layer 416 prior to the definition of the active areas and the isolation barrier regions, the novel method facilitates the creation of the parasitic channels for the PASTT devices.

A silicon nitride layer 420 is deposited overlying the conductive layer 416. The silicon nitride layer 420 acts a polishing stop during the later polish down of the trench filling oxide layer. The silicon nitride layer 420 is preferably deposited by CVD to a thickness of between about 800 Angstroms and 1,500 Angstroms. A pad oxide layer 424 is deposited overlying the silicon nitride layer 420. The pad oxide layer 424 protects the silicon nitride layer during photolithography and improves photoresist adhesion.

Figure 9A:
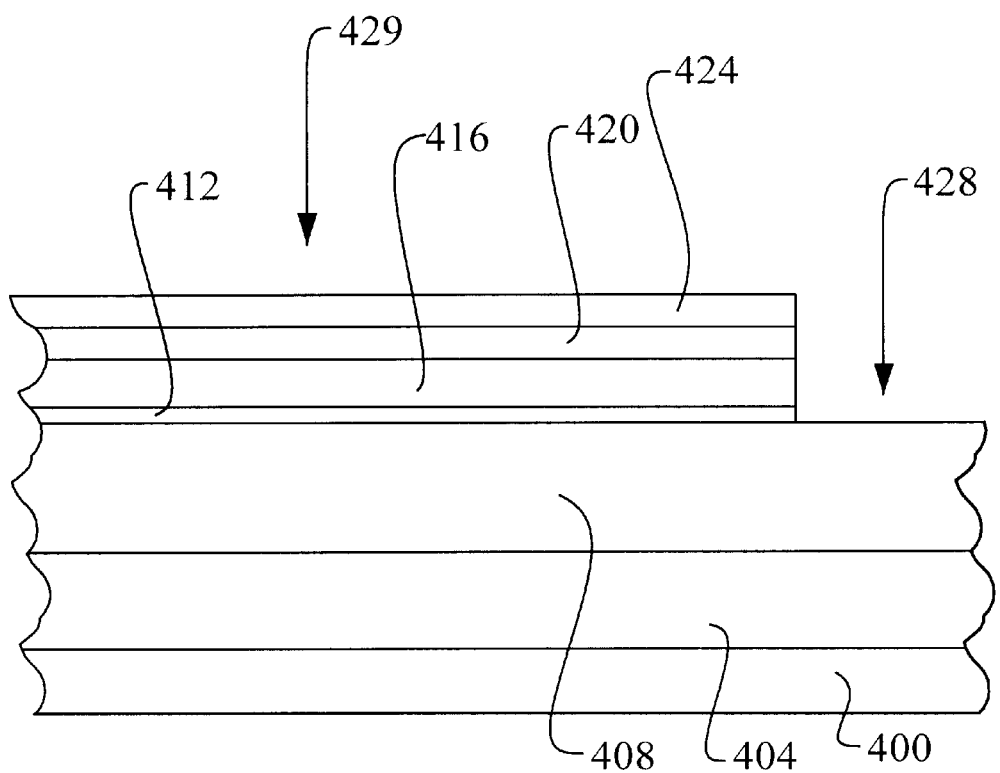

Referring now to FIG. 9a, the A—A cross section is illustrated. The pad oxide layer 424, the silicon nitride layer 420, the first conductive layer 416, and the tunneling oxide layer 412 are patterned to expose the semiconductor substrate 400 where the isolation barrier regions are planned 428 while covering the planned active areas 429. The patterning is performed using, for example, a photolithography sequence wherein a photoresist layer, not shown, is applied overlying the pad oxide layer 424. The photoresist layer is exposed to actinic light through a reticle and is then developed. The patterning is completed by etching through the pad oxide layer 424, the silicon nitride layer 420, the first conductive layer 416, and the tunneling oxide layer 412 using, for example, a reactive ion etch (RIE). Following the etch, the remaining photoresist layer is removed. It is important to note that the patterning step defines the active areas 429 and the isolation barrier regions 428 for the integrated circuit device.

Figure 9B:
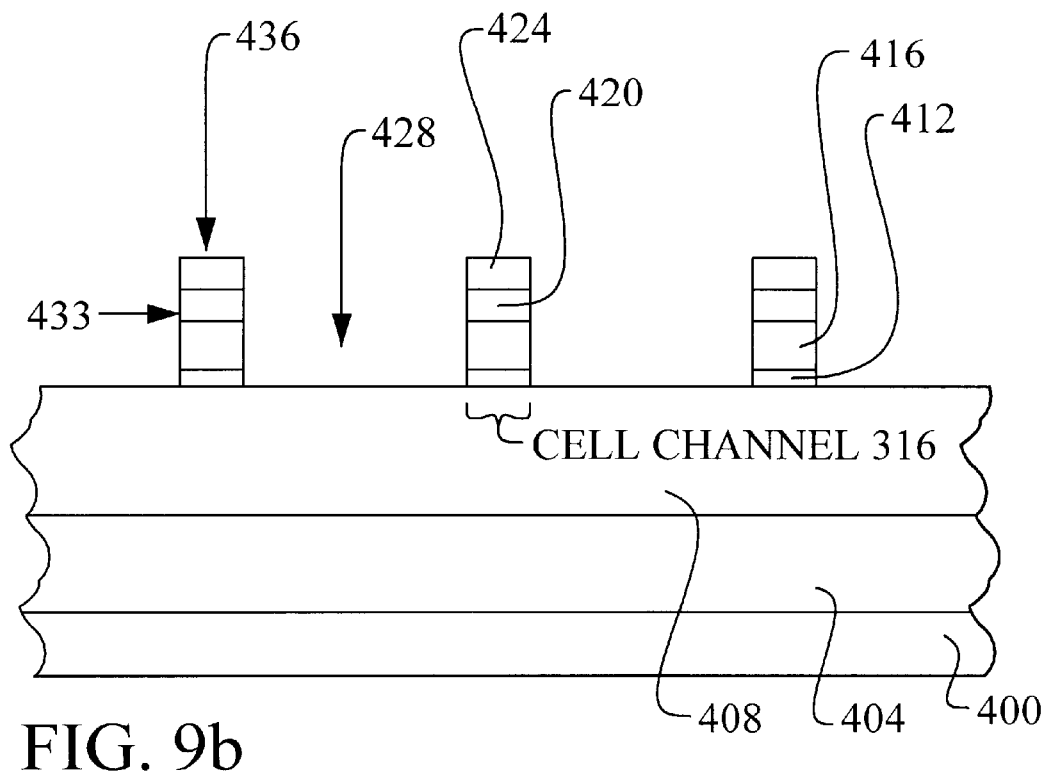

Referring now to FIG. 9b, the B—B cross section is illustrated at the same patterning step as FIG. 9a. Note that, in this orientation, the patterning of the pad oxide layer 424, the silicon nitride layer 420, the first conductive layer 416, and the tunneling oxide layer 412 serves a second purpose. In addition to exposing the semiconductor substrate 400 for the planned isolation barrier regions 428, this step also defines the cell width edges 433 of floating gates for planned Flash memory cells. The width of cell channel 316 is thereby defined in this patterning step. This is a very important feature of the present invention. As will be seen in the subsequent processing, the parasitic channels will be formed next to the outside edges 433 of the cell channel 316.

Figure 10A:
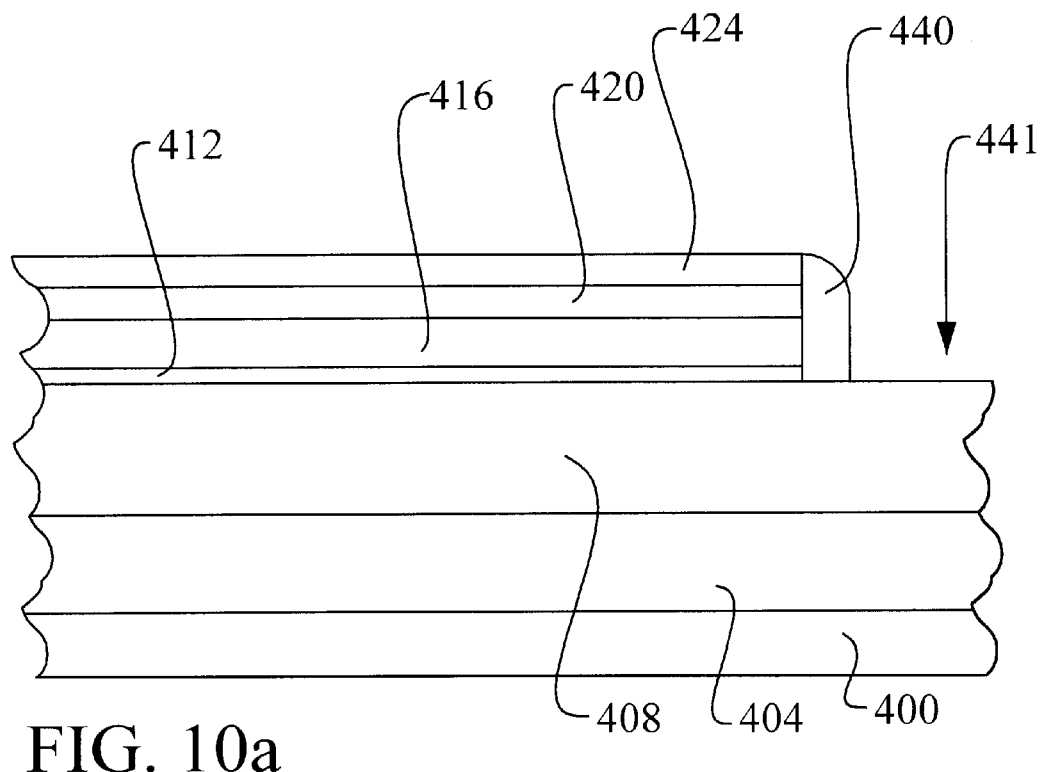

Referring now to FIG. 10a, another important feature of the present invention is shown. As shown on the A—A cross section, temporary sidewall spacers 440 are formed on the edges of the patterned pad oxide layer 424, silicon nitride layer 420, first conductive layer 416, and tunneling oxide layer 412. These temporary sidewall spacers 440 reduce the exposed isolation barrier area 441 of the semiconductor substrate. The temporary sidewall spacers 440 are preferably formed by depositing silicon nitride and then anisotropically etching the silicon nitride.

Figure 10B:
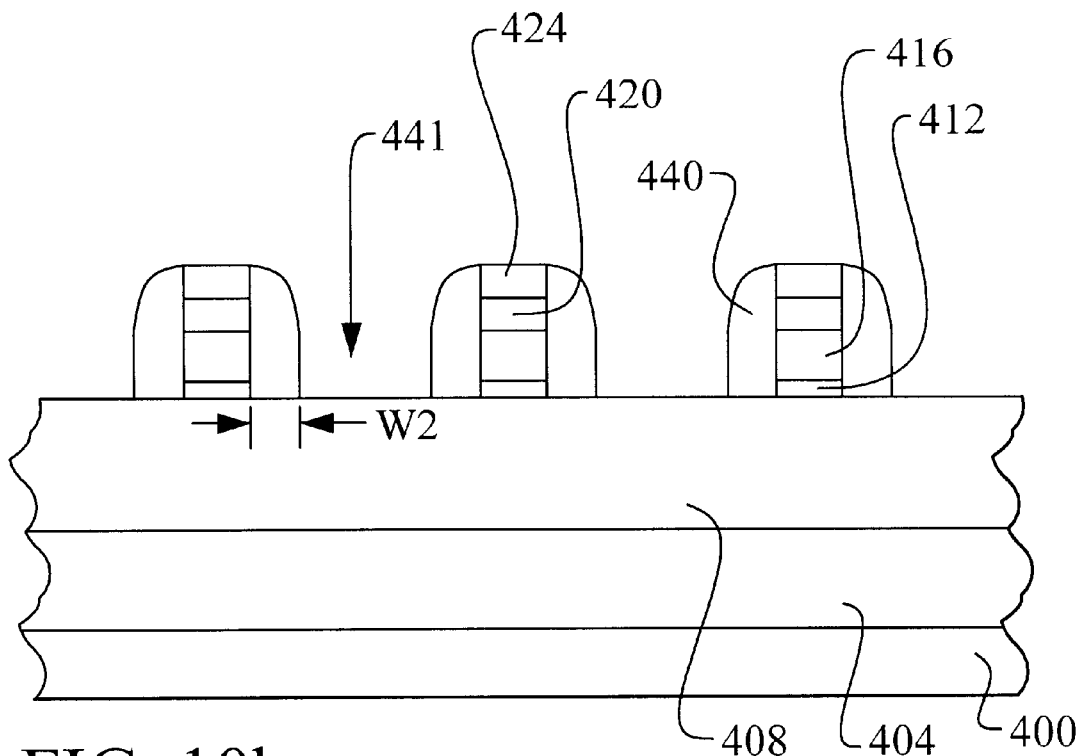

Referring now to FIG. 10b, the cross section B—B is illustrated at this same step. The temporary sidewall spacers 440 are formed on the sidewalls of the pad oxide layer 424, silicon nitride layer 420, first conductive layer 416, and tunneling oxide layer 412. The temporary sidewall spacers 440 are preferably formed to a width W2 of between about 0.025 microns and 0.070 microns. The width W2 of the temporary sidewall spacers 440 will determine the width of the parasitic channels.

Figure 11A:
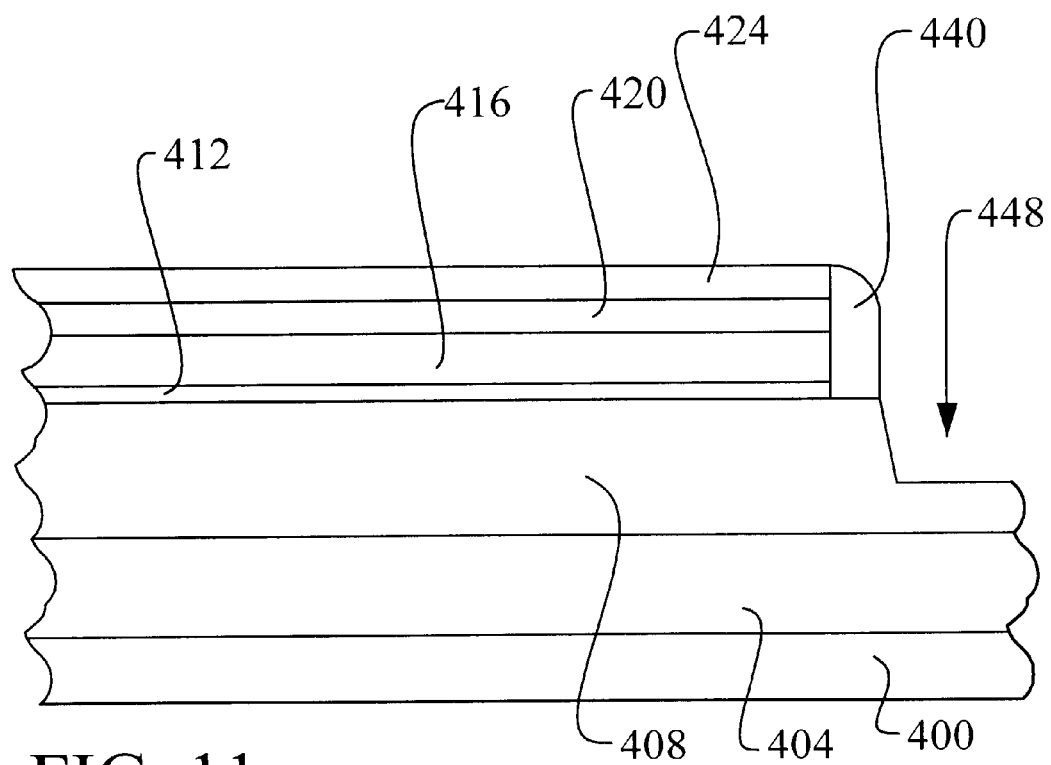

Referring now to FIG. 11a, trenches 448 are etched into the exposed semiconductor substrate 400 for the planned isolation barrier regions. In the preferred embodiment, the isolation barrier regions comprise shallow trench isolations (STI). The exposed semiconductor substrate 400 is etched using, for example, a RIE selective to silicon.

Figure 11B:
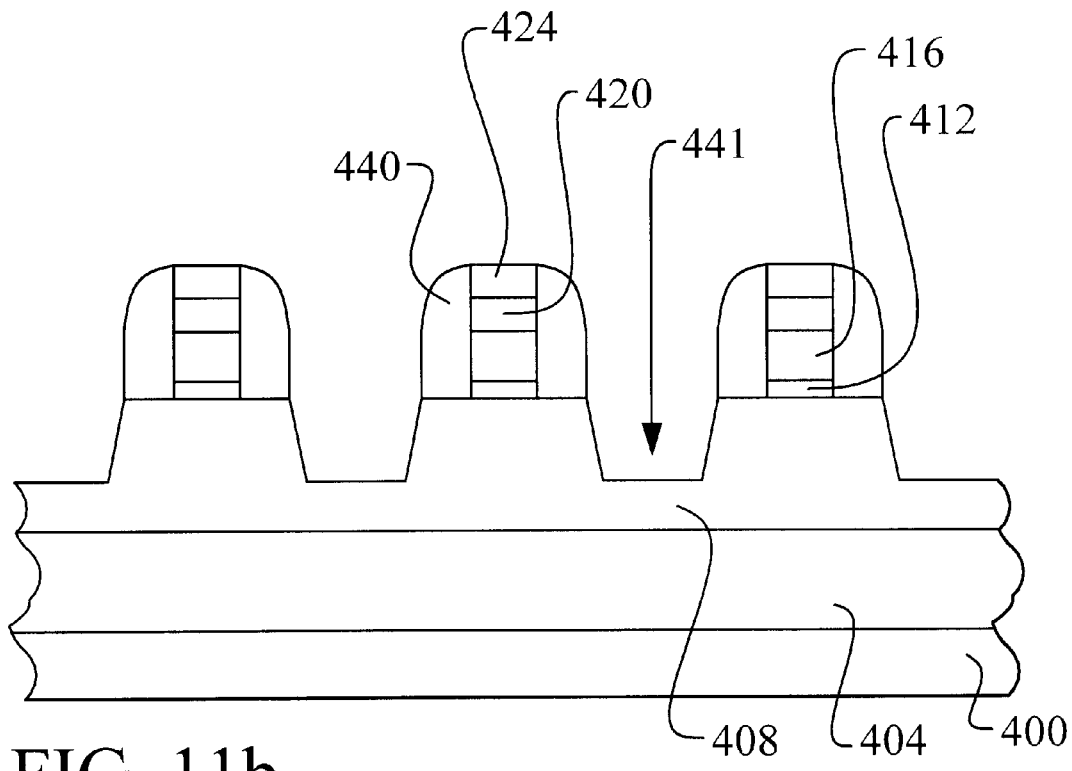

Referring now to FIG. 11b, the B—B cross section shows the result of the STI trench etch. Note that the trenches 448 are offset from the sidewalls of the floating gates by the temporary sidewall spacers 440.

Figure 12A:
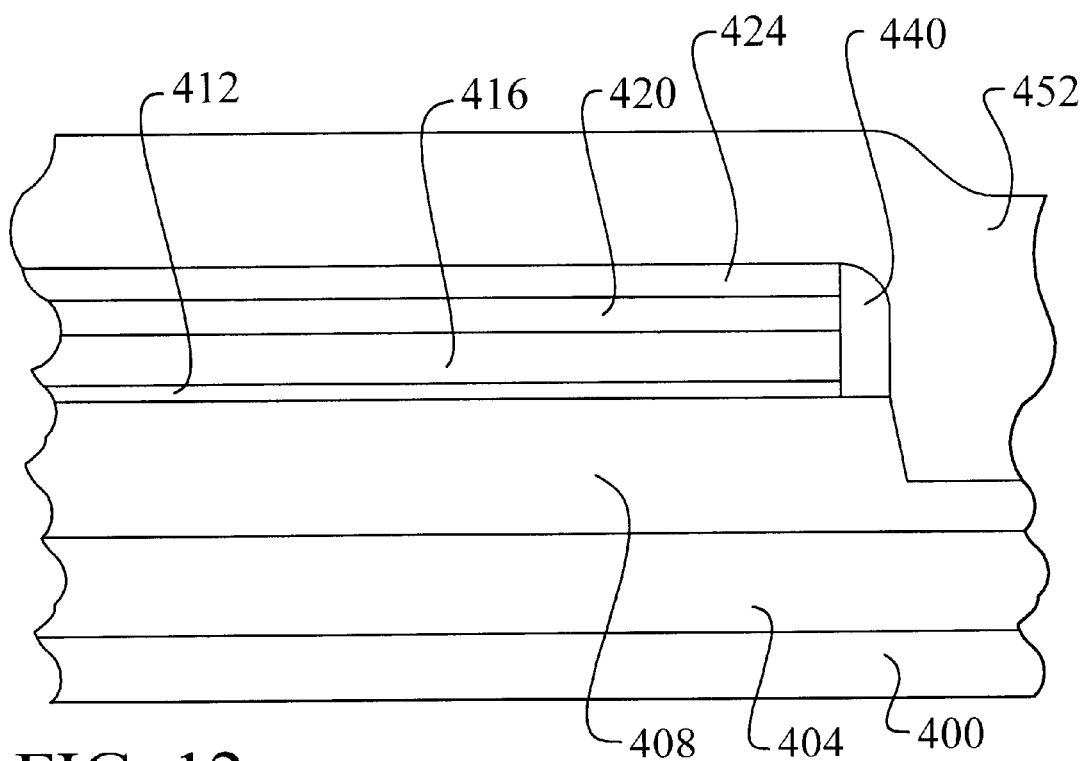

Referring now to FIG. 12a, the A—A cross section is again illustrated. A trench filling oxide layer 452 is deposited overlying the pad oxide layer 424 and the temporary sidewall spacers 440 and filling the trenches. The trench filling oxide layer 452 may be deposited, for example, by an O₃-TEOS CVD process. The trench filling oxide layer 452 is preferably deposited to a thickness of between about 5,500 Angstroms and 7,500 Angstroms. Prior to the trench filling oxide layer 452 deposition, corner rounding etching or liner oxidation may be used to improve the performance of the STI.

Figure 13A:
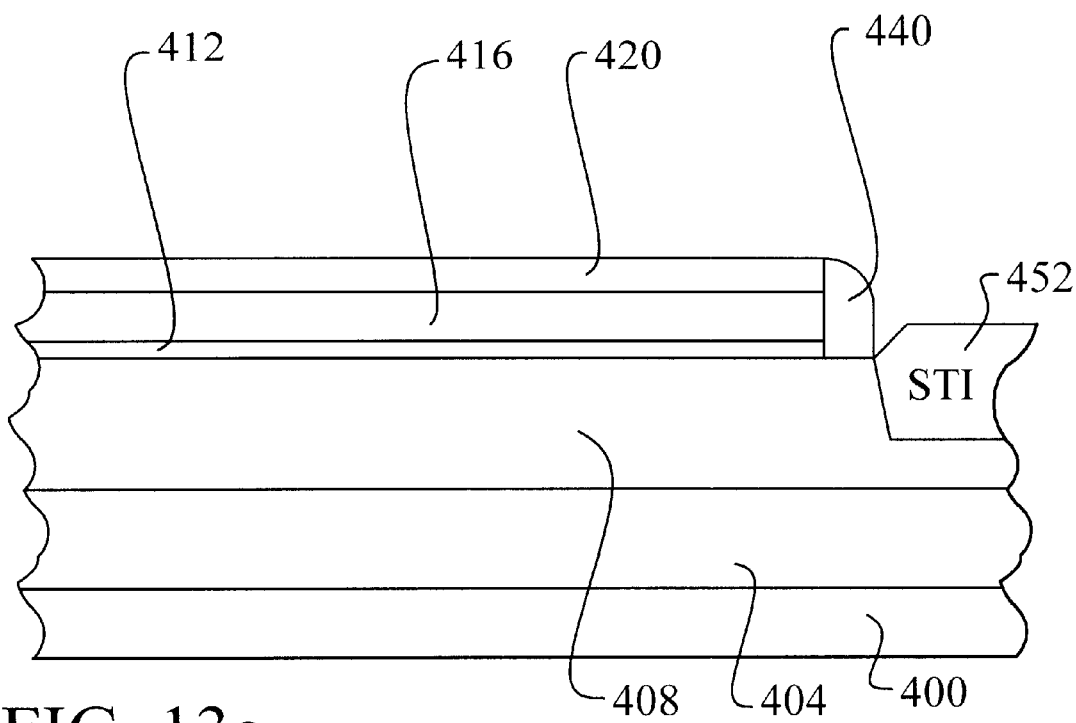

Referring now to FIG. 13*a,* the trench filling oxide layer 452 is polished down to complete the shallow trench isolations (STI) 452. This polishing down step preferably comprises a chemical mechanical polish (CMP). Note that the pad oxide layer 424 is likewise polished away during the polish down step. The silicon nitride layer 420 preferably acts as a polishing stop to prevent encroachment into the first conductive layer 416. In addition, note that the completion of the STI regions 452 defines the non-STI regions of the semiconductor substrate 400 as active areas.

Figure 14A:
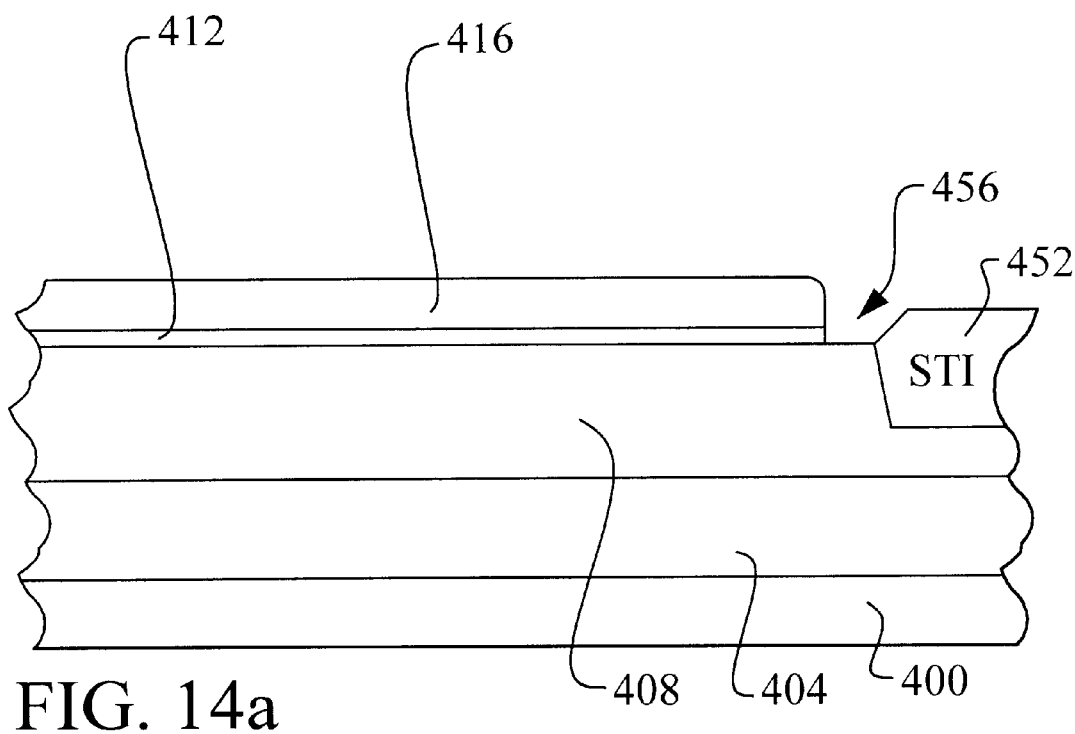

Referring now to FIG. 14*a,* another important feature of the present invention is illustrated. The temporary sidewall spacers 440 are removed. The temporary sidewall spacers 440 may be removed using, for example, a wet etch comprising hot $H_3PO_4$ or by a dry etch.

Figure 14B:
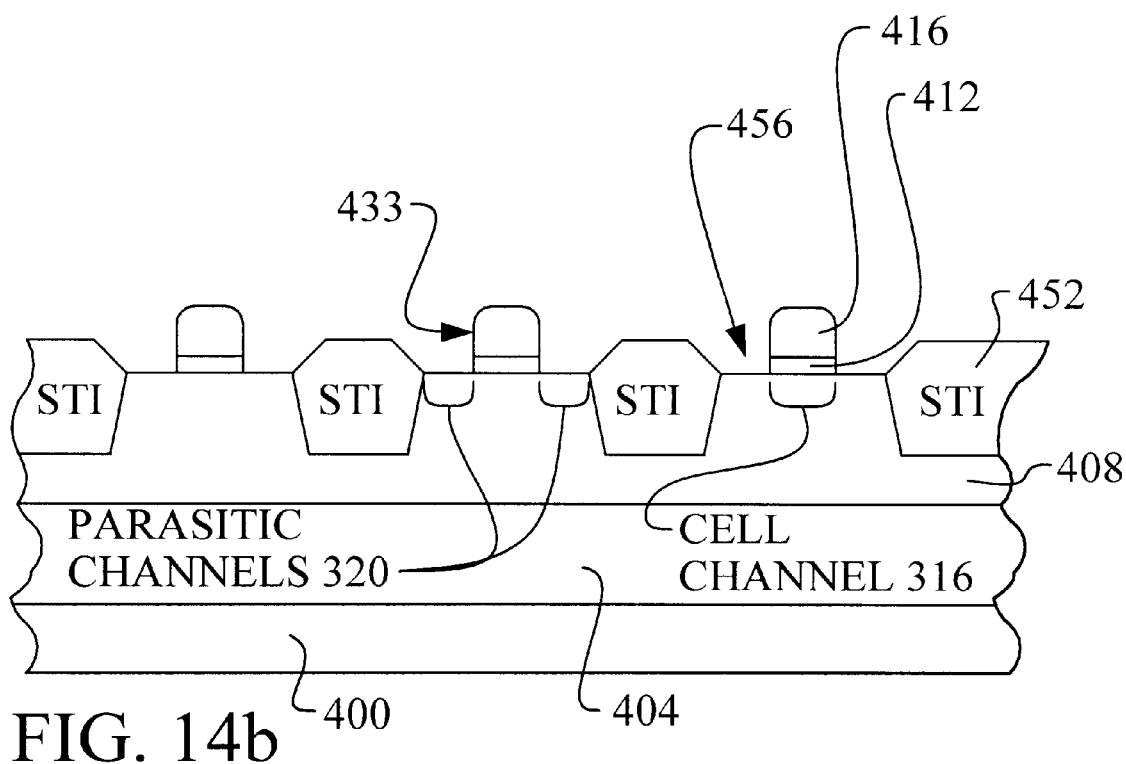

Referring now to FIG. 14*b,* the B—B cross section is again illustrated. The removal of the temporary sidewall spacers 440 exposes the active areas 456 in the semiconductor substrate 400 between the STI 452 and the cell width edges 433 of the first conductive layer 416. At this point in the process, the parasitic channels 320 and the cell channels 316 for the partially completed Flash cells can be seen. The cell channels 316 comprise the unexposed semiconductor substrate 400 underlying the tunneling oxide 412 and the first conductive layer 416. The parasitic channels 320 comprise the exposed active areas between the STI 452 and the cell channels 316.

It is particularly important to note that the parasitic channels 320 for the PASTT devices are formed on the top surface of the semiconductor substrate 400 rather on the side-wall slope of the STI trenches as in the prior art SWATT Flash cell example. By forming the parasitic channels 320 on the top surface and by controlling the width of these channels 320 using the width of the temporary sidewall spacers, the method of the present invention maintains closer control over the width of the PASTT devices. As discussed above, precise control of the transfer-transistor width is key to precise control of the voltage threshold of these devices.

Figure 15A:
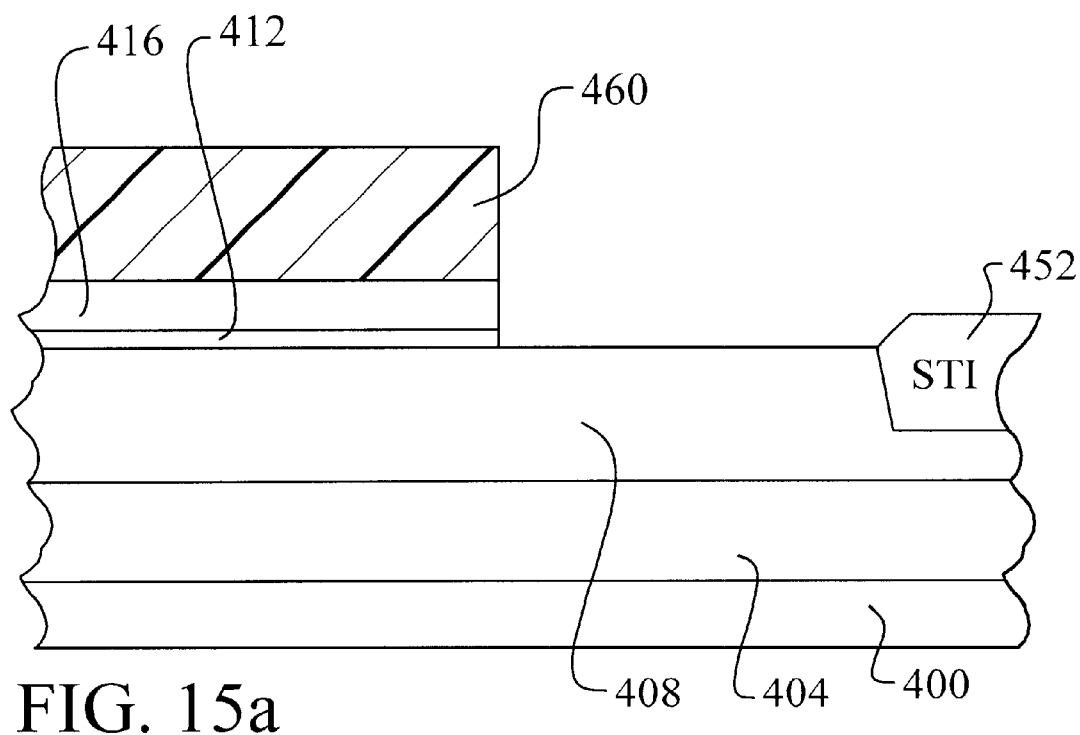

Referring now to FIG. 15*a,* the first conductive layer 416 and the tunneling oxide layer 412 are removed from areas where floating gate devices are not planned. For example, the selection transistor 317 formed by the intersection of BL2 and SG1 in FIG. 7, does not have a floating gate. It is necessary, therefore, to remove the first conductive layer 416 and the tunneling oxide layer 412 in the area where this transistor 317 will be formed. A photoresist layer 460 is applied overlying the first conductive layer 416 and is then patterned using the photolithography technique discussed above. A RIE etch may then be performed to remove the first conductive layer 416 and the tunneling oxide layer 412.

Figure 16A:
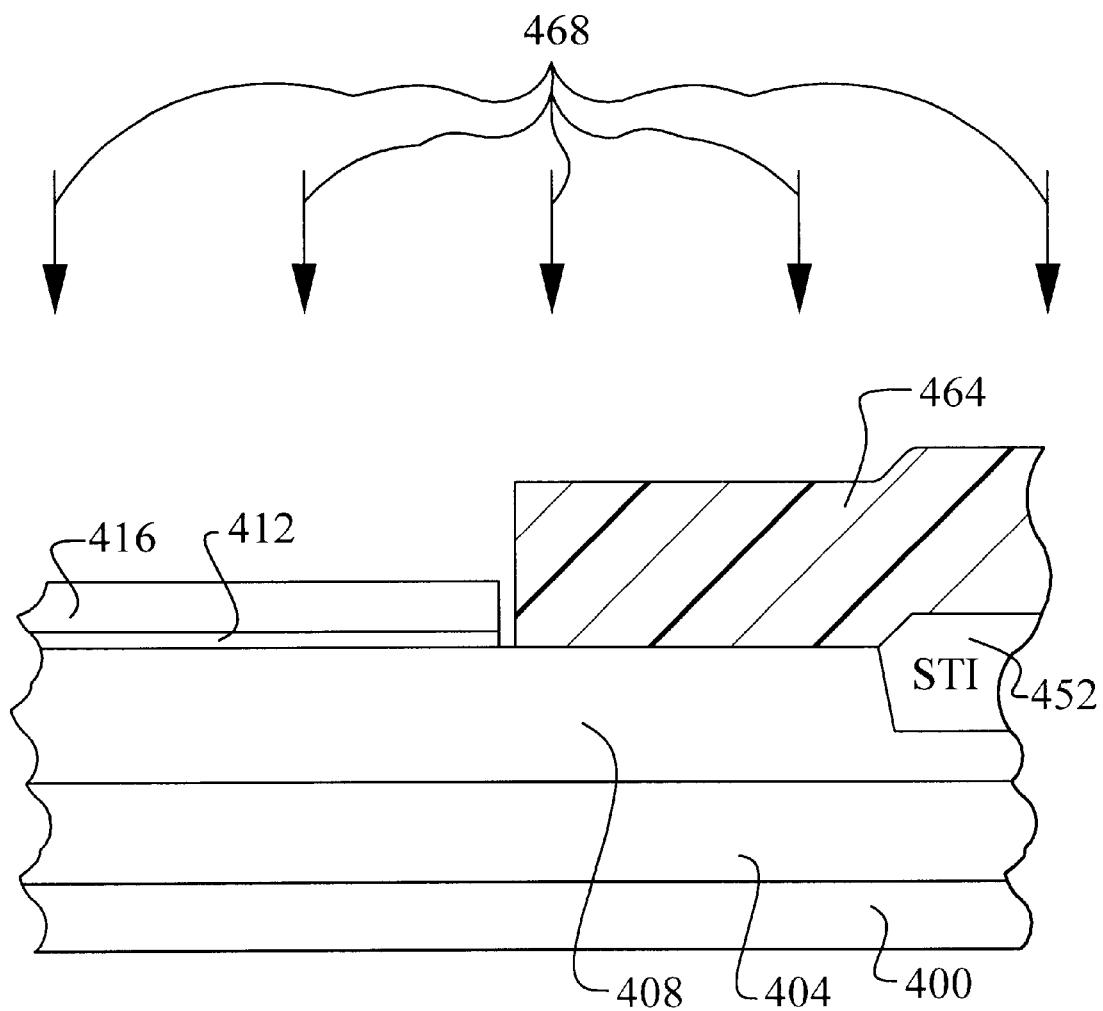
Figure 16B:
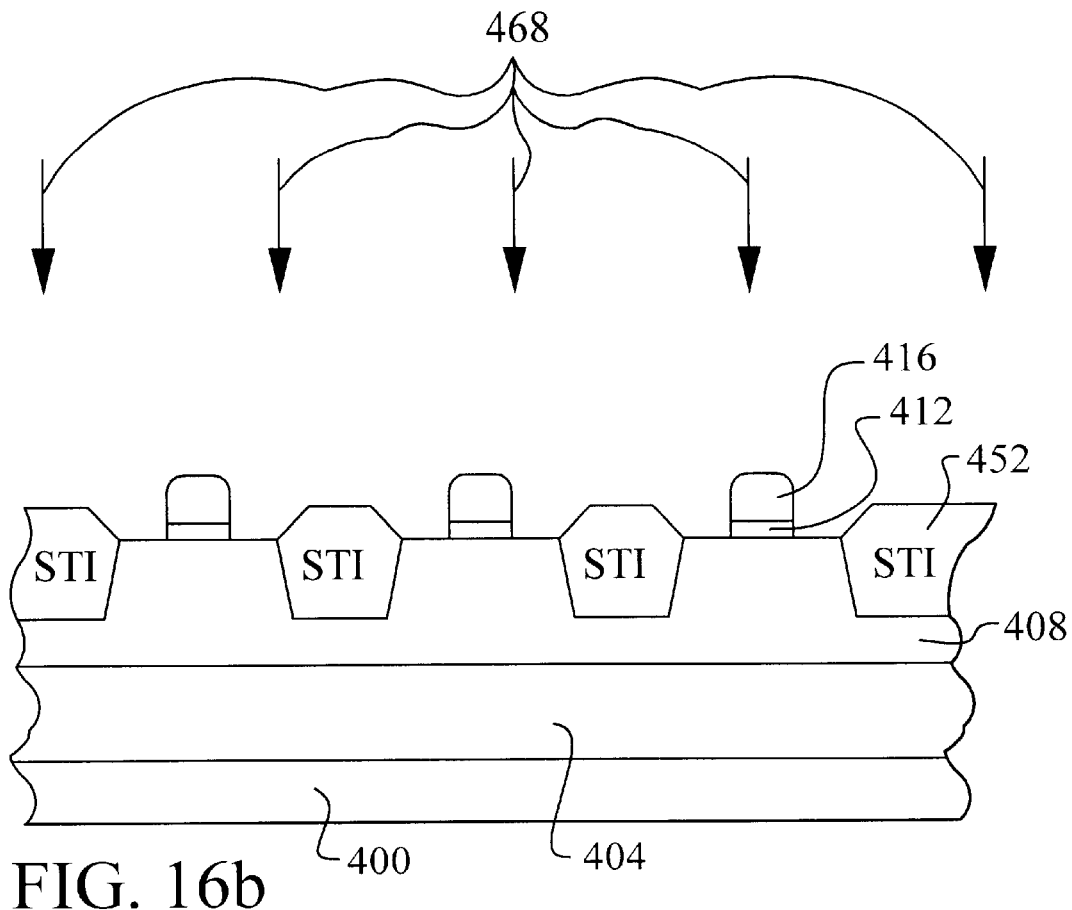

Referring now to FIG. 16*a,* the semiconductor substrate 400 is ion implanted 468 to thereby adjust the threshold voltage of the Flash memory cells and the PASTT devices. The threshold ion implant 468 is masked from non-Flash cell areas using a mask 464. For example, a photoresist layer 464 is applied overlying the first conductive layer 416 and the semiconductor substrate 400. The photoresist layer 464 is then patterned using the photolithographic process described earlier. The ion implantation 468 preferably comprises boron ions implanted at a dose of between about $1\times10^{10}$ atoms/cm² and $1\times10^{13}$ atoms/cm² and an energy of between about 5 KeV and 20 KeV. The target voltage threshold for the PASTT devices when used in a four-level system is between about 3.9 Volts and 4.5 Volts. The threshold voltage ion implantation 468 is illustrated for the B—B cross section in FIG. 16*b.* It is important to note that the threshold voltage ion implantation step 468 allows the method of the present invention to carefully control the $V_{th}$ of the transfer transistors.

Figure 17A:
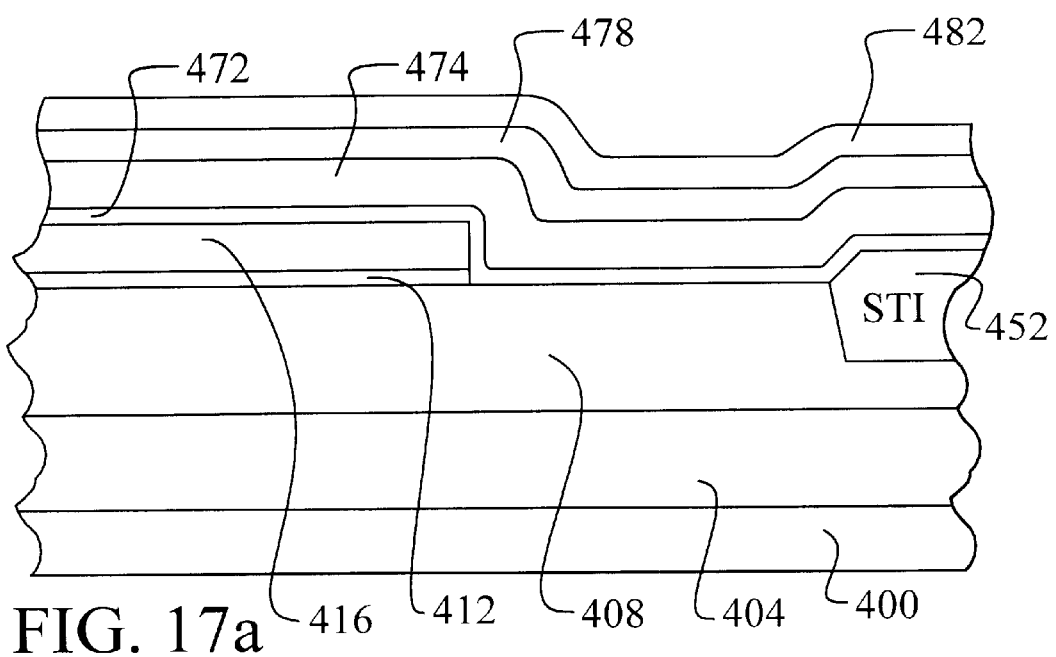

Referring now to FIG. 17*a,* an interlevel dielectric layer 472 is deposited overlying the first conductive layer 416 and the semiconductor substrate 400. The interlevel dielectric layer 472 preferably comprises a laminated stack of silicon dioxide, silicon nitride, and silicon dioxide and is called ONO. The interlevel dielectric layer 472 is preferably deposited by CVD to a thickness of between about 80 Angstroms and 150 Angstroms. The interlevel dielectric layer 472 forms the dielectric between the floating gates and the control gates of the Flash cells. Further, the interlevel dielectric layer 472 forms the gate oxide for the PASTT devices.

A second conductive layer 474 is deposited overlying the interlevel dielectric layer 472. The second conductive layer 474 will form the control gate electrode for the Flash cells and the gate electrode for the PASTT devices. The second conductive layer 474 preferably comprises polysilicon that is deposited to a thickness of between about 700 Angstroms and 1,500 Angstroms. A tungsten silicide ($WSi_x$) layer 478 may be deposited overlying the second conductive layer 474 to reduce resistivity. Finally, a capping layer 482 of silicon nitride may be deposited overlying the tungsten silicide layer 478.

Figure 17B:
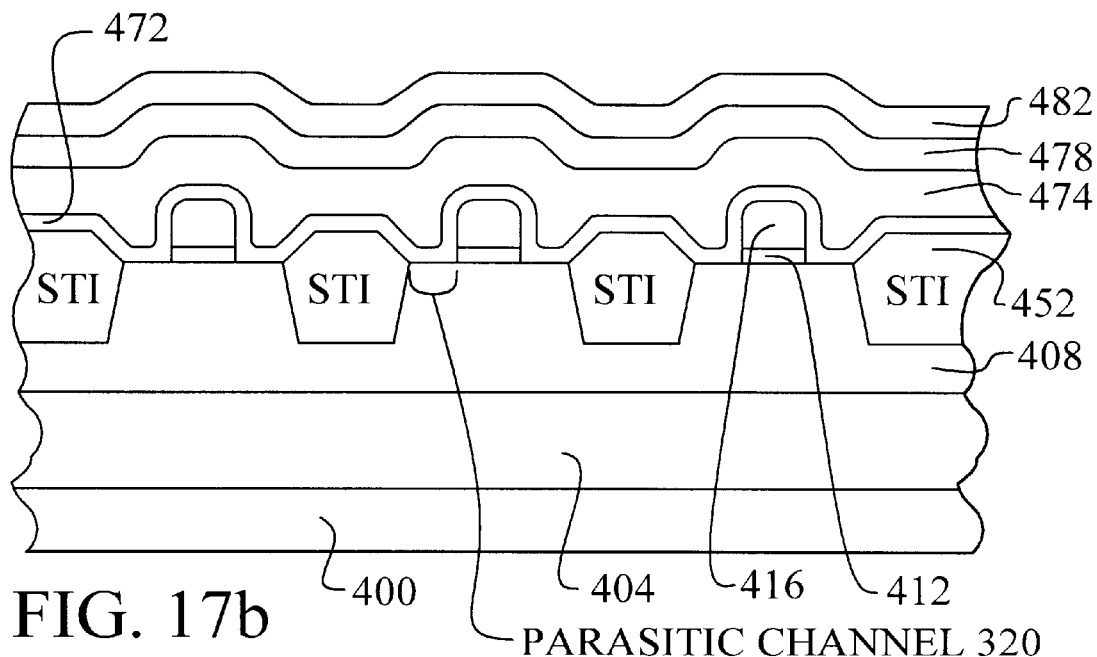

Referring now to FIG. 17*b,* the B—B cross section is illustrated. The deposition of the interlevel dielectric layer 472 and the second conductive layer 474 is particularly important. Note that the second conductive layer 474 overlies the first conductive layer 416 with the interlevel dielectric layer 472 therebetween. Further, the first conductive layer 416 overlies the semiconductor substrate 400 with the tunneling oxide layer 412 therebetween. This stack of 474, 472, 416, and 412 creates the control gates 474 and 472 and the floating gates 416 and 412 for the Flash cells. Further, the second conductive layer 474 overlies the parasitic channel 320 with the interlevel dielectric layer 472 therebetween to thereby form the parasitic gates of the PASTT devices.

Figure 18A:
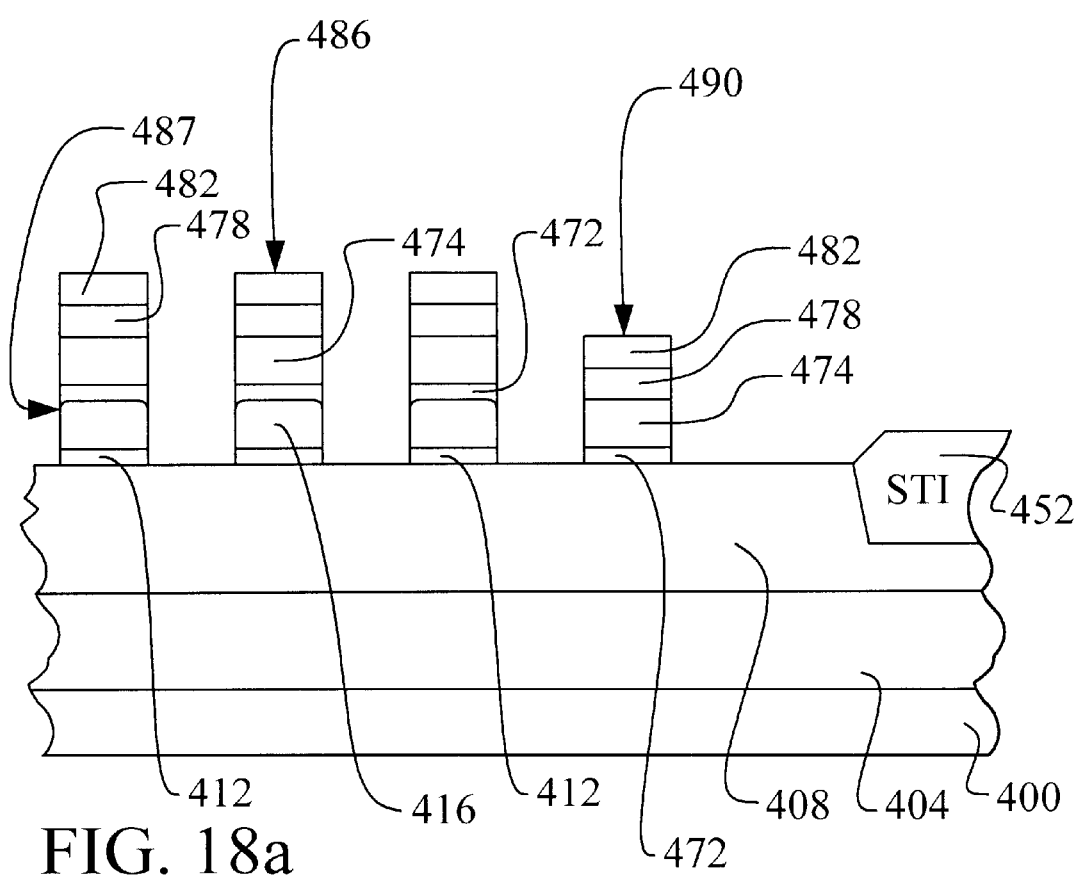

Referring now to FIG. 18*a,* the capping layer 482, the tungsten silicide layer 478, the second conductive layer 474, the interlevel dielectric layer 472, the first conductive layer 416, and the tunneling oxide layer 412 are patterned to form the control gates and to define the length edges 487 of the floating gates for the Flash memory cells. The patterning step comprises, for example, applying a photoresist layer, not shown, overlying the capping layer 482. The photoresist layer is then patterned using the earlier described photolithography technique. A RIE etch is preferably used to pattern the layer stack and the remaining photoresist is removed. Note that the cross section B—B direction is completely masked from the etch and remains unchanged from FIG. 17*b.* Note also that the selection transistors 490 and the Flash cells 486 are defined in this patterning step.

Figure 19A:
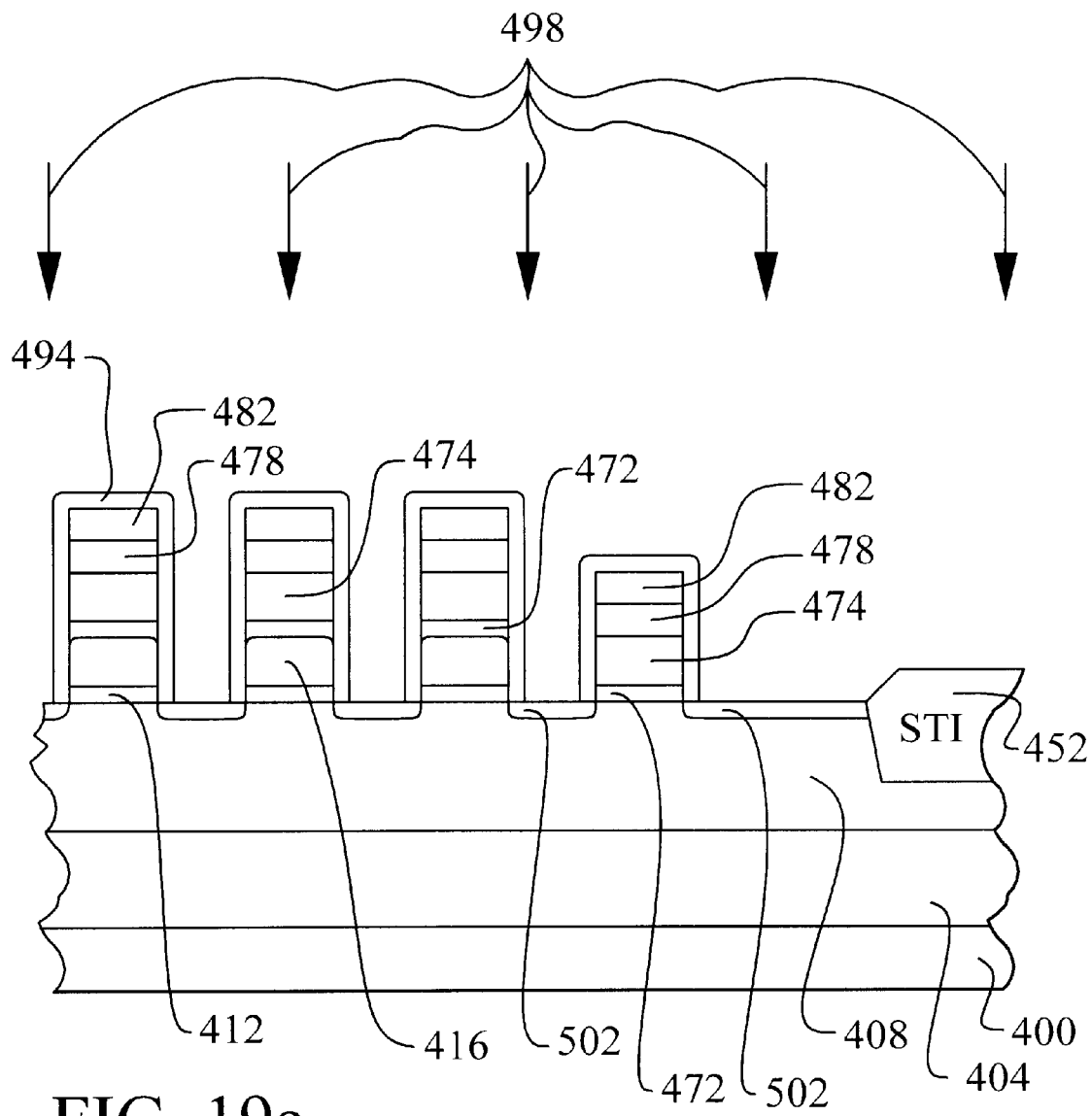

Referring now to FIG. 19*a,* the semiconductor substrate 400 is ion implanted 498 to form lightly doped source and drain (LDD) regions 502 if the process uses LDD to improve short-channel performance. The ion implantation 498 is self-aligned to the edges of the Flash cell stacks. A sidewall oxide layer 494 may be deposited overlying the Flash cell stacks prior to the ion implantation.

Figure 20A:
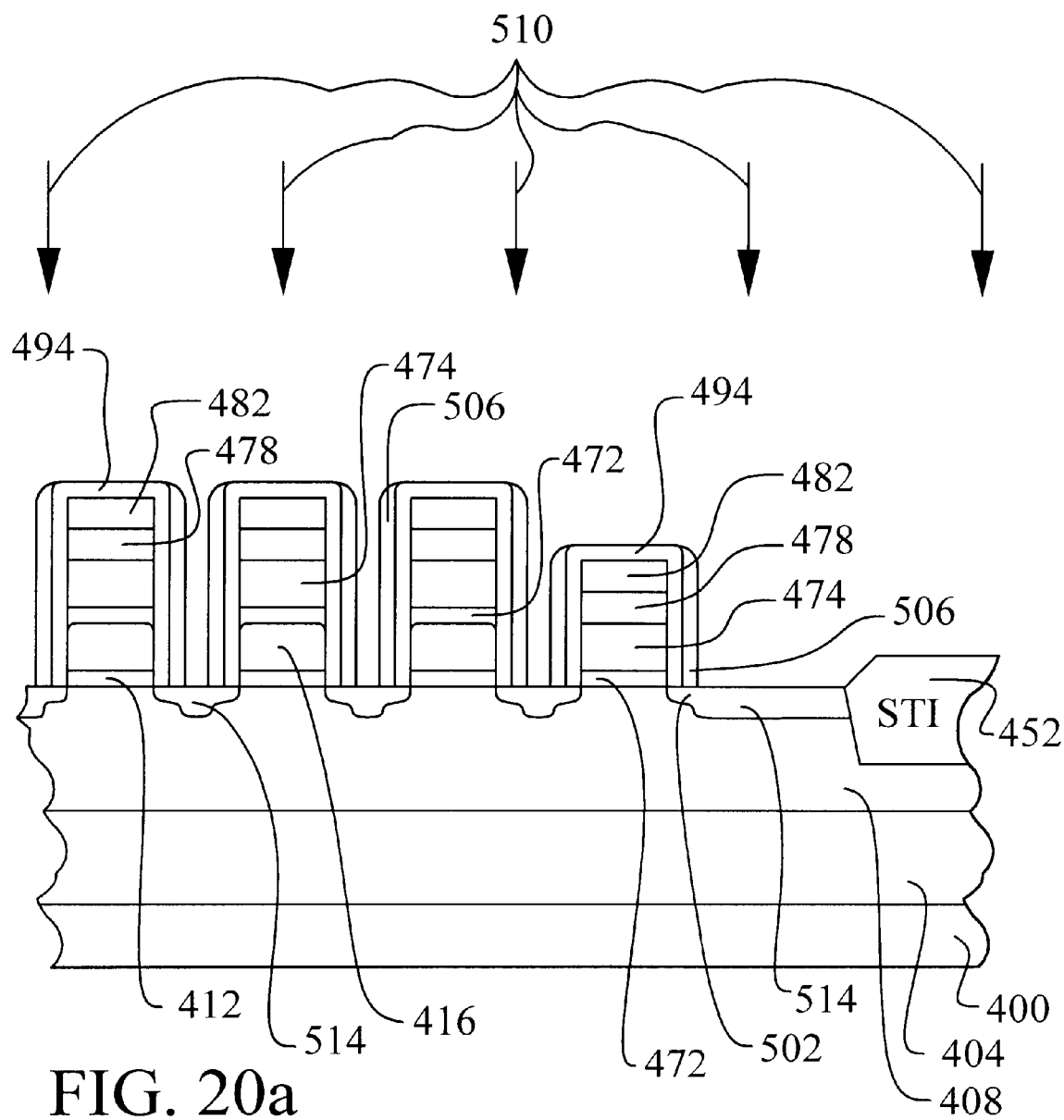

Referring now to FIG. 20a, permanent sidewall spacers 506 are formed on the sidewalls of the Flash cell stacks. The permanent sidewall spacers 506 may comprise silicon nitride that is deposited and etched back to form sidewalls. The semiconductor substrate 400 is then ion implanted 510 to form source and drain junctions 514 for the Flash cells and for the PASTT devices. The presence of the permanent sidewall spacers 506 offsets the source and drain junctions 514 from the tunneling oxide 412 layer to improve short-channel performance.

Figure 21A:
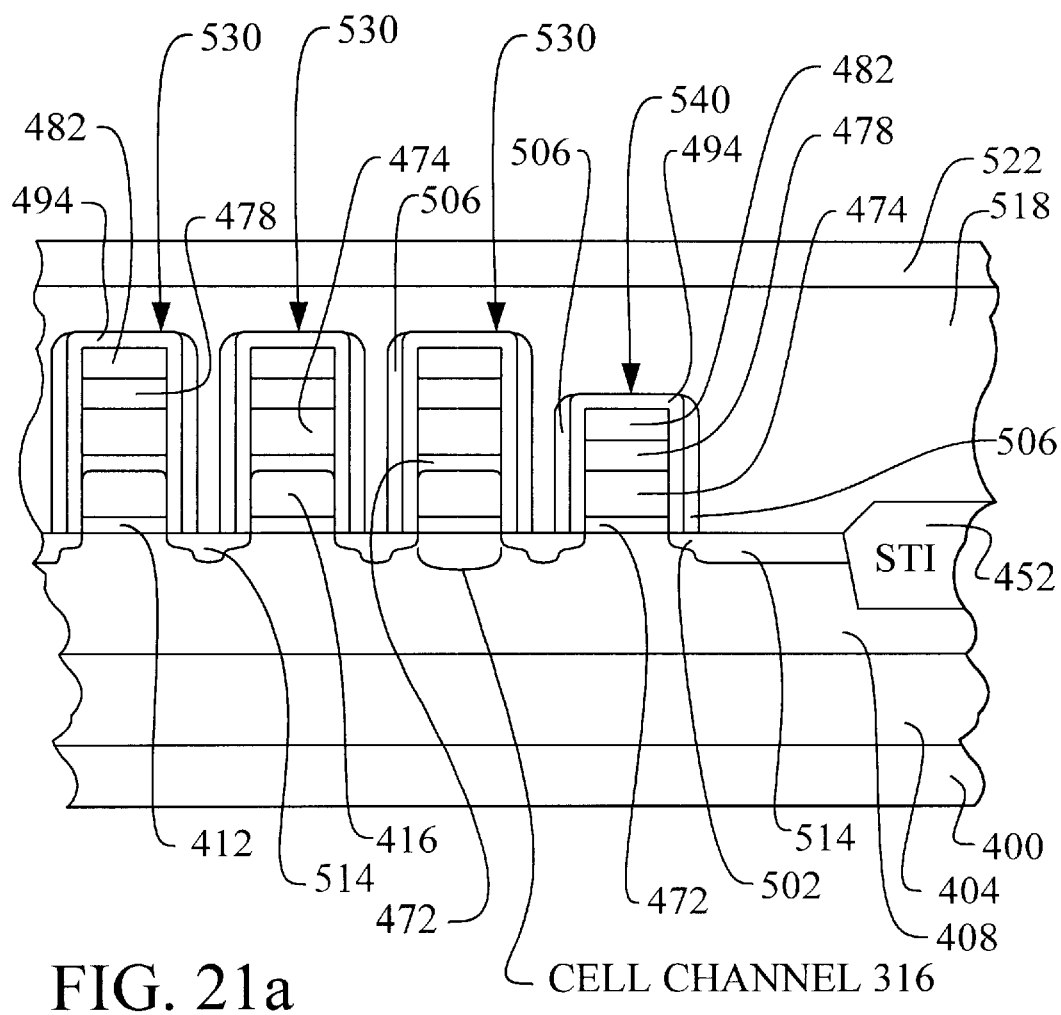
Figure 21B:
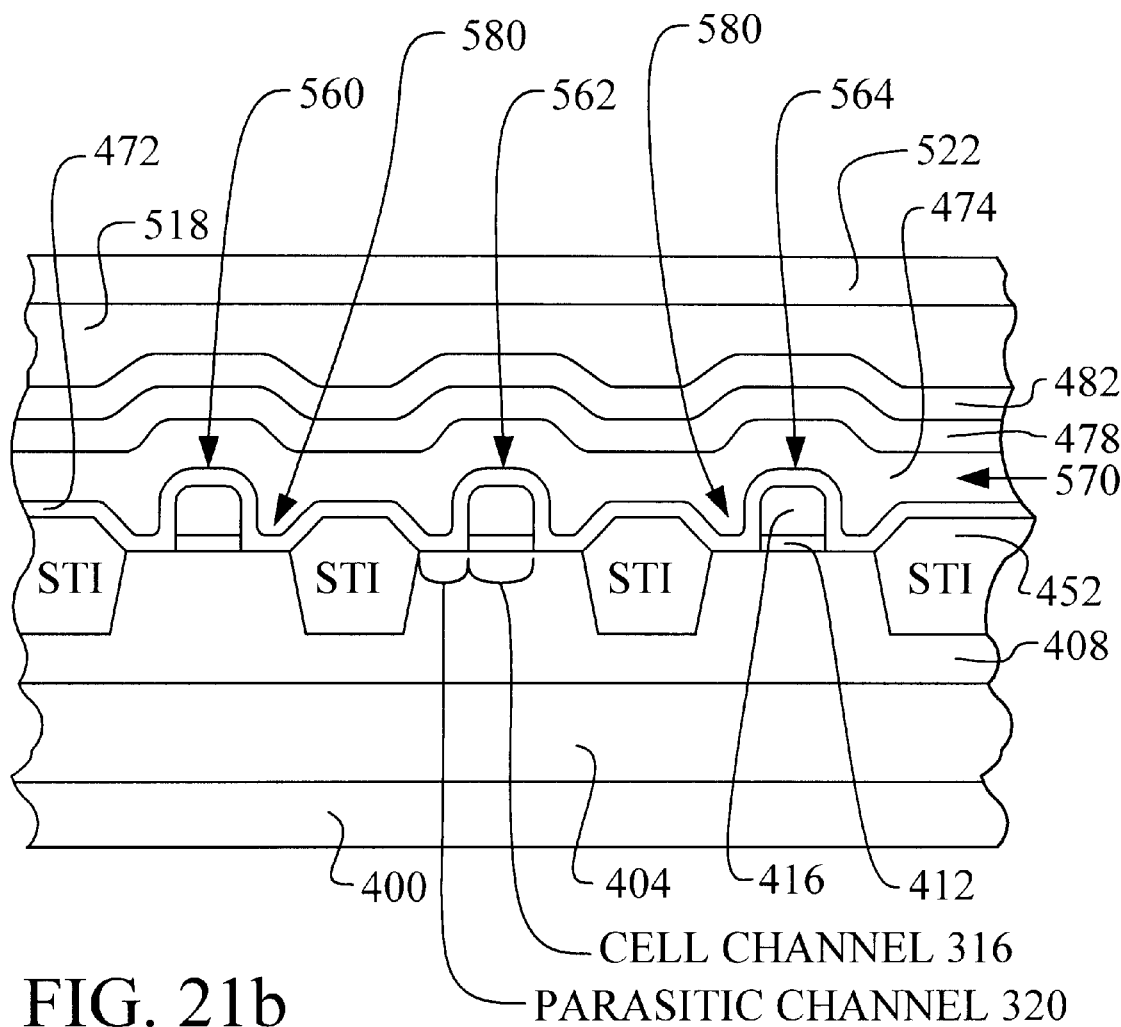

Referring now to FIG. 21a, a isolation dielectric layer 518 and a cap oxide layer 522 are deposited to complete the Flash memory cells and the PASTT devices in the manufacture of the Flash memory integrated circuit device. The isolation dielectric layer 518 may comprise borophosphosilicate glass (BPSG). The final B—B cross section is illustrated in FIG. 21b.

Referring once again to FIG. 21a and 21b, the novel Flash memory cell device with a parasitic surface transfer transistor (PASTT) may now be described. The device comprises, first, a semiconductor substrate 400, 404, and 408 or, simply, 400. The semiconductor substrate 400 further comprises an active area and an isolation barrier region 452. The isolation barrier region comprises STI 452, and the active area comprises all other areas. Source and drain junctions 514 are in the active area of the semiconductor substrate 400. The source and drain junctions 514 may additionally comprise lightly doped regions 502. A cell channel 316 is in the active area extending from the drain junction 514 and 502 to the source junction 514 and 502. A parasitic channel 320 is in the active area on the top surface of the semiconductor substrate 400 extending from the drain junction 514 and 502 to the source junction 514 and 502. The parasitic channel 320 is bounded on one side by the isolation barrier region 452 and on another side by the cell channel 316. A floating gate 416 and 412 comprises a first conductive layer 416 overlying the cell channel 316 with a tunneling oxide layer 412 therebetween. The floating gate 416 and 412 does not overlie the parasitic channel 320. A control gate 474 and 472 comprises a second conductive layer 474 overlying the floating gate 416 with an interlevel dielectric layer 472 therebetween. A parasitic surface transfer-transistor (PASTT) gate 474 and 472 comprises the second conductive layer 474 overlying the parasitic channel 320 with the interlevel dielectric layer 472 therebetween. The PASTT gate 474 and 472 inverts the parasitic channel 320 to turn ON the PASTT device at a parasitic threshold voltage.

Note that the PASTT Flash cell of the present invention can achieve a small cell size of about 0.67 microns$^2$ for a 0.35 microns design rule.

Figure 22:
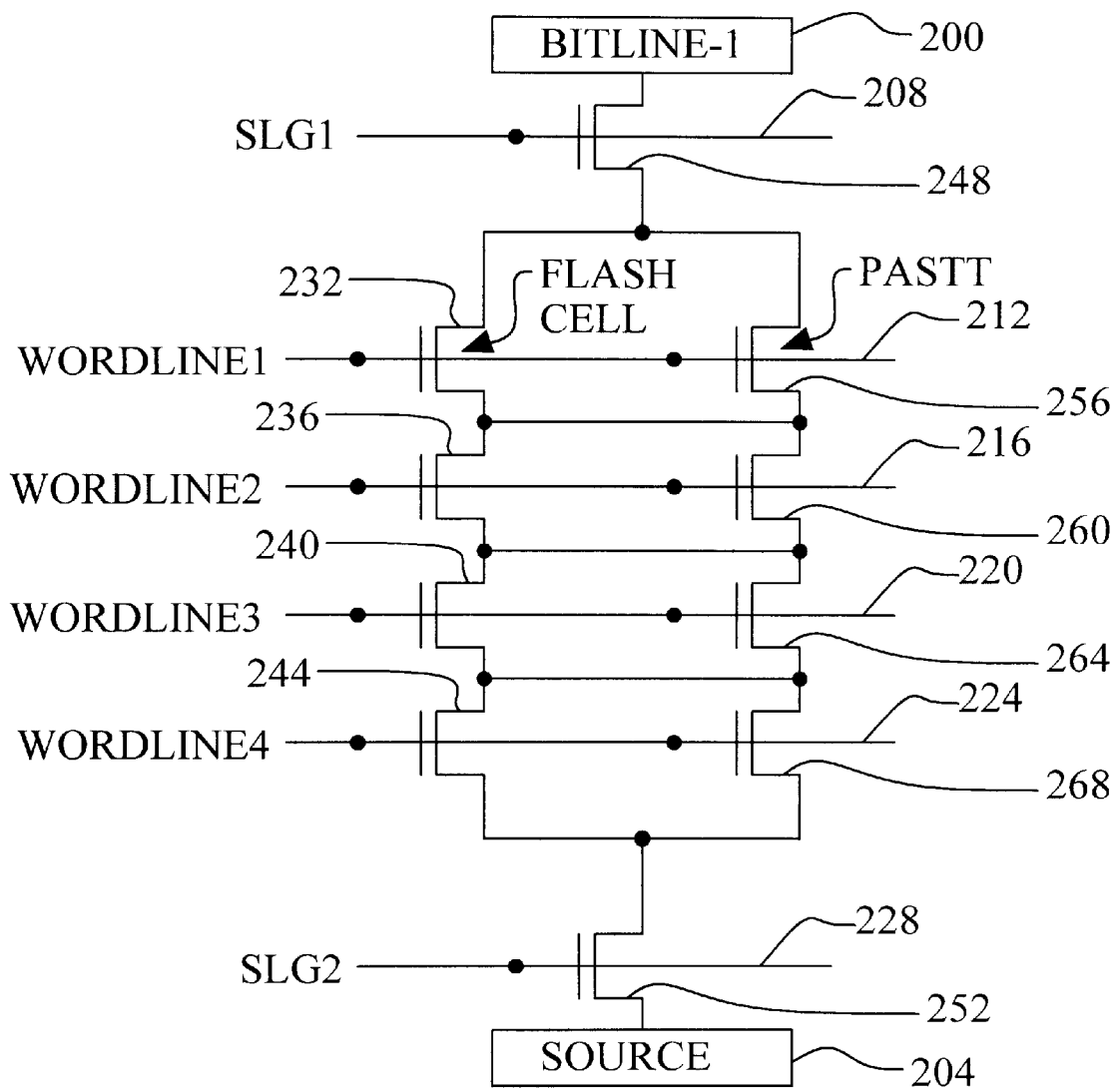
FIG. 22 illustrates schematically a portion of a memory array of the preferred embodiment of the present invention.

Referring now to FIG. 22, the performance of the preferred embodiment of the present invention may now be discussed. A portion of the memory array of the preferred embodiment of the present invention is illustrated schematically. A single bit-line series of Flash cells 232, 236, 240, and 244 are shown. The Flash cells 232, 236, 240, and 244 are connected in series between the BITLINE-1 200 selection transistor 248 and the SOURCE 204 selection transistor 252. Each Flash cell 232, 236, 240, and 244 comprises a control gate and floating gate stack wherein the control gate is connected to a word-line signal. For example, WORDLINE1 212 is connected to the control gate of the top Flash cell 232.

An important feature of the present invention is the presence of the parasitic surface transfer-transistors (PASTT) 256, 260, 264, and 268 in parallel with each of the Flash cells 232, 236, 240, and 244. The gates of the PASTT devices 256, 260, 264, and 268 are formed by the word-lines 212, 216, 220, and 224.

The Flash cells of the present invention are preferably programmed and erased using Fowler-Nordheim tunneling. The Flash cells may be programmed in a binary, or bi-level, configuration where the negative voltage threshold state, or erased state, is defined as a logic "0" and the positive voltage threshold state, or programmed state, is defined as a logic "1". Alternatively, the Flash cells may be programmed in a multi-level arrangement. In a multi-level arrangement, each Flash cell can take on any of four logical values: "0", "1", "2", and "3". Each logical value corresponds to a different threshold voltage programmed onto the Flash cell via negative charge introduction onto the floating gate.

The PASTT devices 256, 260, 264, and 268 play a key role in the method of reading the logic state of a selected Flash cell. When the logic state of a cell is read, the word-lines of all of the non-selected cells are driven to 5 Volts. The selection transistor 248 for the BITLINE-1 is turned ON by driving the SLG1 signal to 5 Volts. The selection transistor 252 for the SOURCE 204 is also turned ON by driving the SLG2 signal to 5 Volts. For example, consider the case where the NAND Flash array is operating as a bi-level memory and the Flash cell 236 is being read. WORDLINE1 212, WORDLINE3 220, and WORDLINE4 224 are driven to 5 Volts. In this state, PASTT devices 256, 264, and 268 are guaranteed to be ON because the voltage threshold of these devices is guaranteed to be less than about 5 Volts. In addition, since WORDLINE2 216 is driven to about 0 Volts during the read operation, the PASTT device 260 connected to WORDLINE2 216 is OFF. The state of the Flash cell 236 can easily be determined by a sense amp connected to BITLINE-1 200.

Figure 23:
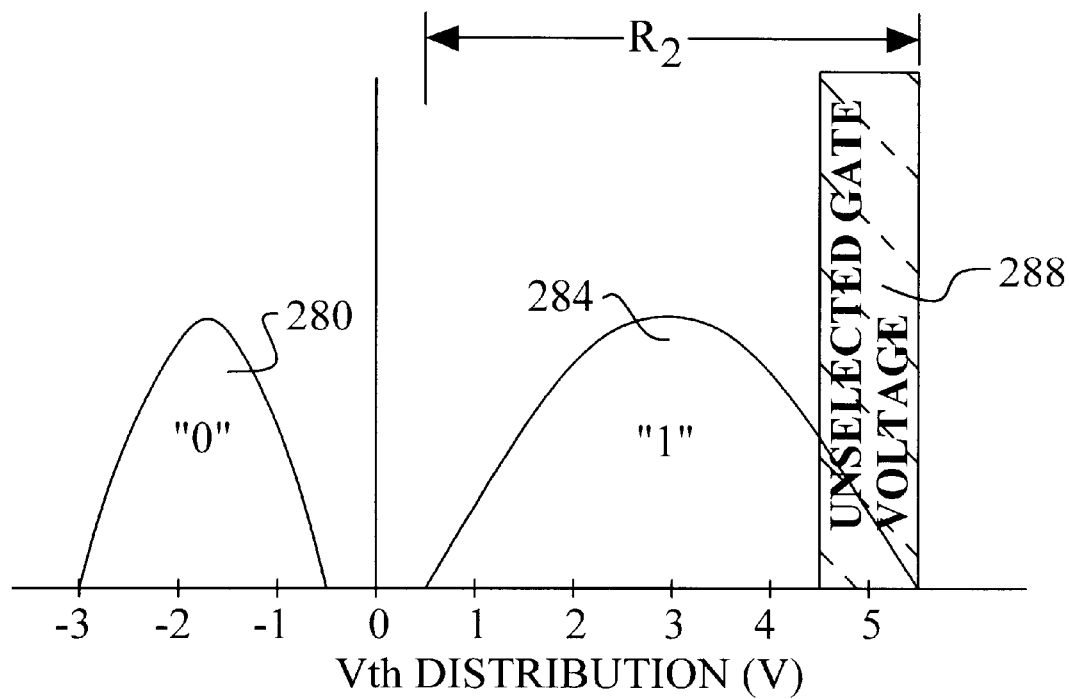
FIG. 23 illustrates graphically the threshold voltage ($V_{th}$) distribution of the preferred embodiment of the Flash memory device of the present invention in a bi-level scheme.

Referring now to FIG. 23, the threshold voltage ($V_{th}$) distribution for the Flash cells in the bi-level scheme is illustrated graphically. Note that, as in the prior art case, the "0" level cells have a negative $V_{th}$ with a distribution 280 between about −0.5 Volts and −3 Volts. However, now the "1" level distribution 284 can be much larger than in the prior art case. The "1" range R2 begins at about 0.5 and extends to above 5 Volts. This extended range R2 is possible because the presence of the PASTT devices in parallel with each Flash cell insures that the unselected cells in the NAND array will conduct even if these unselected Flash cells are in a "1" level state with a $V_{th}$ exceeding 5 Volts. This feature allows the "1" range R2 to be extended. The programming time is reduced because the number of program/verify cycles is reduced. In addition, the data retention is greater due to the increased margin possible between "0" state and "1" state $V_{th}$ values. It important to note that the PASTT device voltage threshold is preferably set to between about 0 Volts and 4.5 Volts for the bi-level mode.

Figure 1:
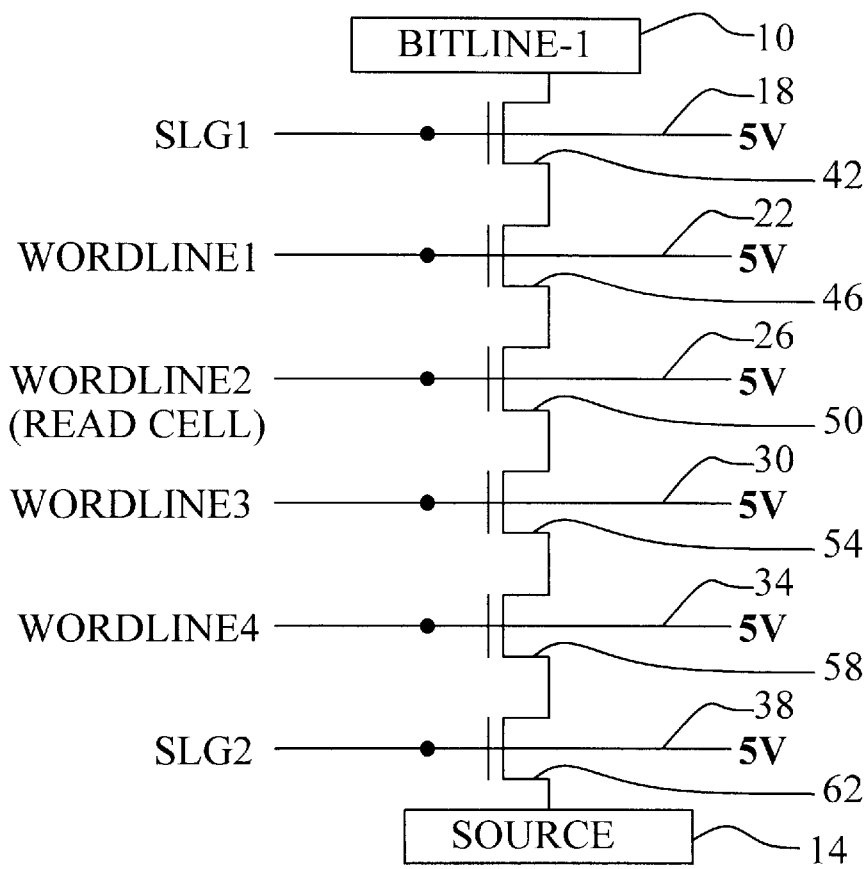
FIG. 1 illustrates schematically a portion of a prior art NAND-type Flash EEPROM memory device.
Figure 2:
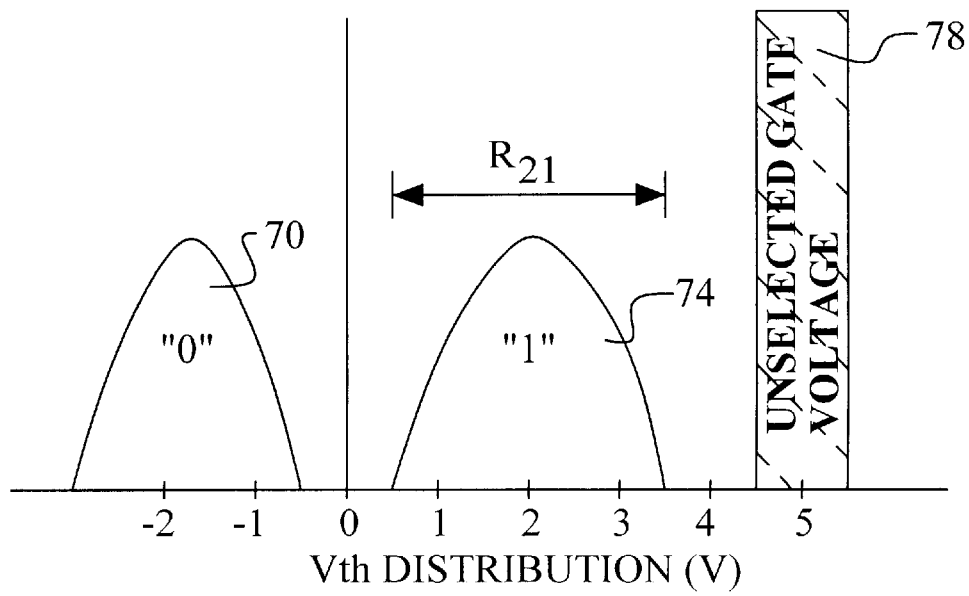
FIG. 2 illustrates graphically the threshold voltage ($V_{th}$) distribution of the prior art Flash memory device in a bi-level scheme.
Figure 3:
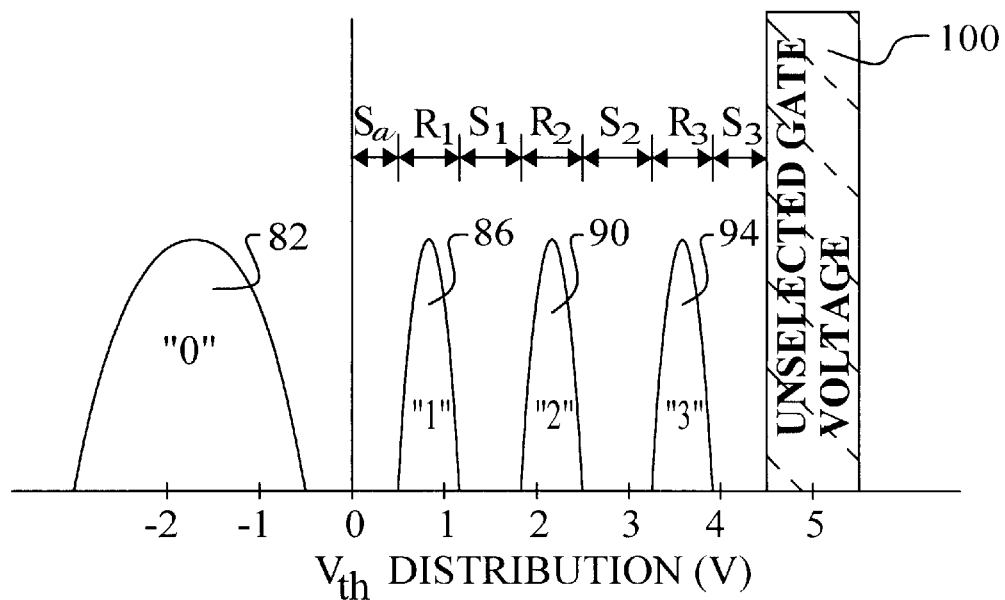
FIG. 3 illustrates graphically the threshold voltage ($V_{th}$) distribution of the prior art Flash memory device in a four-level scheme.
Figure 4:
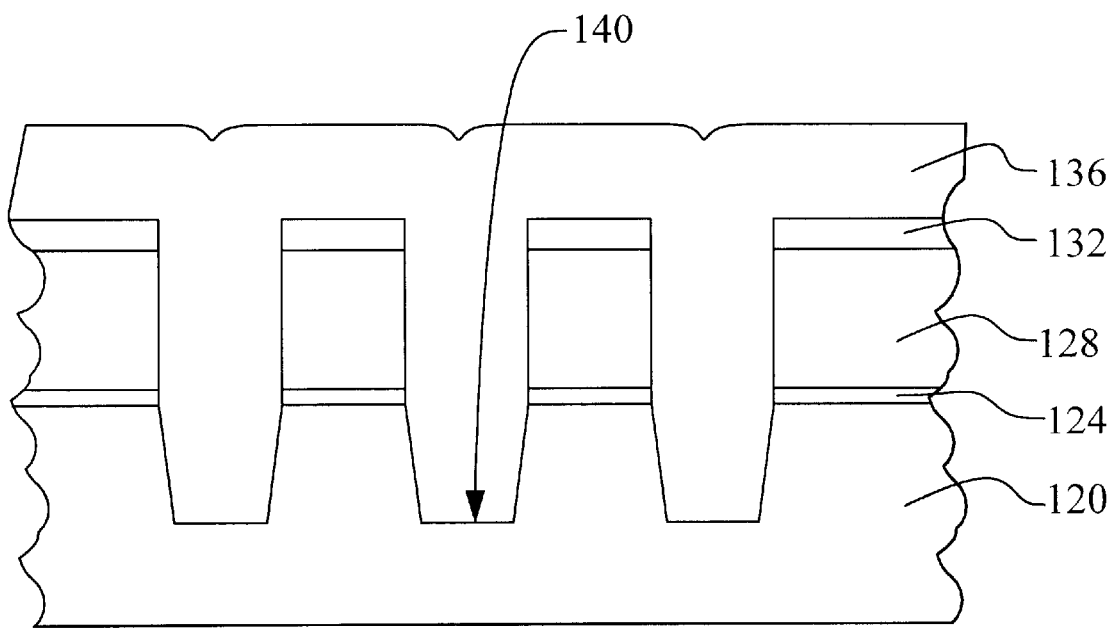
FIGS. 4 through 6 illustrates in cross section a partially completed prior art Flash memory device featuring side-wall transfer-transistor (SWATT) cells.
Figure 5:
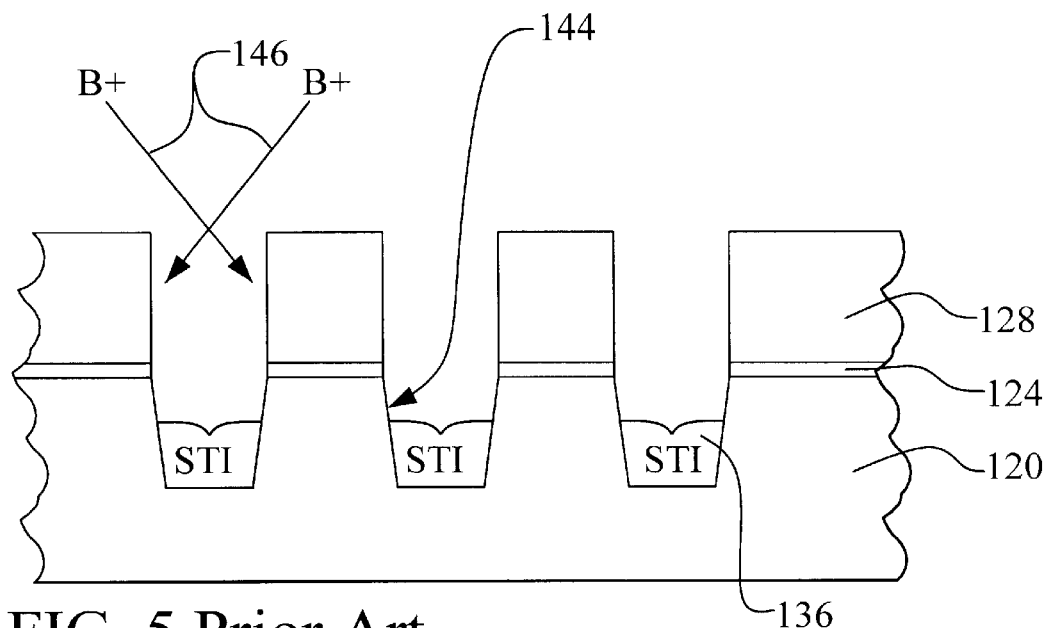
Figure 6:
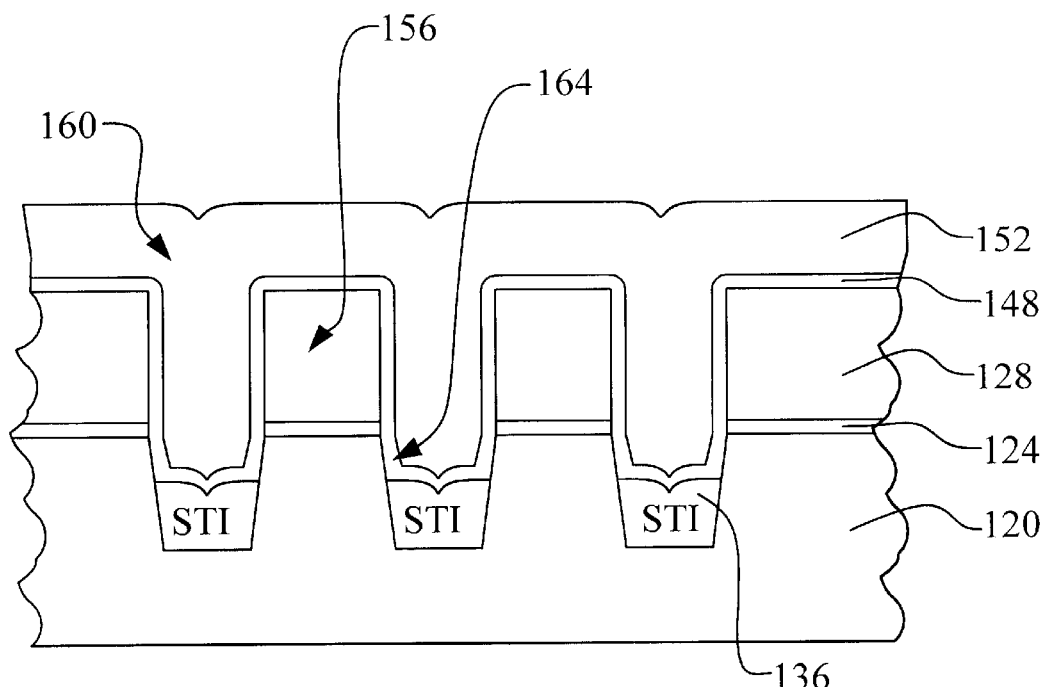
Figure 24:
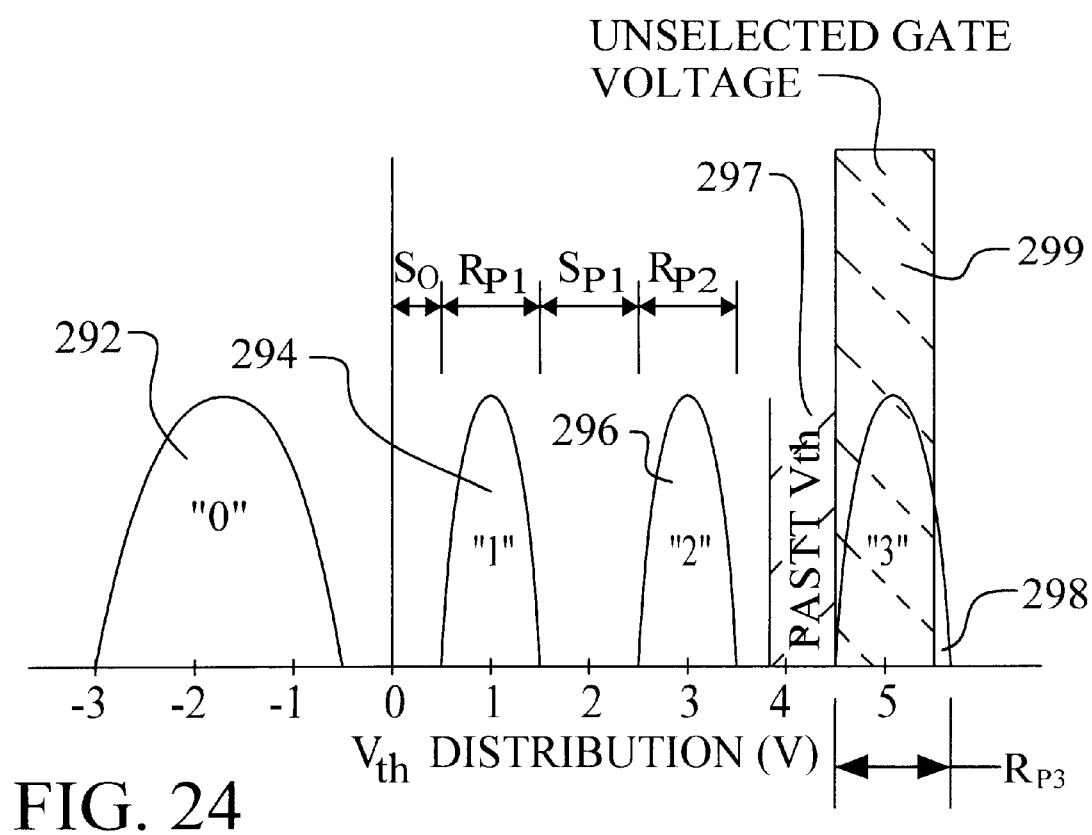
FIG. 24 illustrates graphically the threshold voltage ($V_{th}$) distribution of the preferred embodiment of the Flash memory device of the present invention in a four-level scheme.

Referring now to FIG. 24, a multi-level NAND setup is illustrated. In this configuration, each Flash cell is programmed in one of four states, "0", "1", "2", and "3". Note that the "1", "2", and "3" levels are narrowly distributed 294, 296, and 298 and have tight ranges of $R_{P1}$, $R_{P2}$, and $R_{P3}$, respectively. However, note that the ranges $R_{P1}$, $R_{P2}$, and $R_{P3}$ are wider than those of the prior art example of FIG. 3. For example, ranges $R_{P1}$ and $R_{P2}$ of the present invention may be about 1.1 Volts. In the prior art example, the comparable ranges $R_1$ and $R_2$ were about 0.6 Volts. These increase ranges are possible even though the space between the ranges $S_{P1}$ remains about 0.8 Volts as in the prior art.

The reason the level ranges can be expanded is because the "3" level distribution 298 is moved up to the unselected gate voltage range. The presence of the PASTT devices in each Flash cell allow the "3" voltage threshold to be moved up to about 5 Volts. Once again, this is possible because a gate voltage of about 5 Volts is guaranteed to turn ON the PASTT devices so that the NAND reading scheme will always work.

An important feature of the present invention is the tight control of the voltage threshold ($V_{th}$) of the PASTT devices when used in this four-level configuration. For the four-level scheme outlined in FIG. 24 to work properly, the PASTT $V_{th}$ distribution 297 must be kept between about 3.9 Volts and 4.5 Volts. The PASTT device must turn ON at the lowest possible unselected gate voltage 299 of about 4.5 Volts. The novel device and method of fabrication of the present invention provides a distinct advantage over the prior art SWATT Flash memory cell by improving the ability to tightly control the $V_{th}$ value of the transfer-transistor.

The increased spacing and ranges of the four-level configuration achieved in the present invention provide the advantage of reducing the programming time. This is because the verification ranges reduce the verification time for the program/verify cycle. In addition, data retention failures are reduced because of wider tolerance for each of the logic levels.

Figure 25:
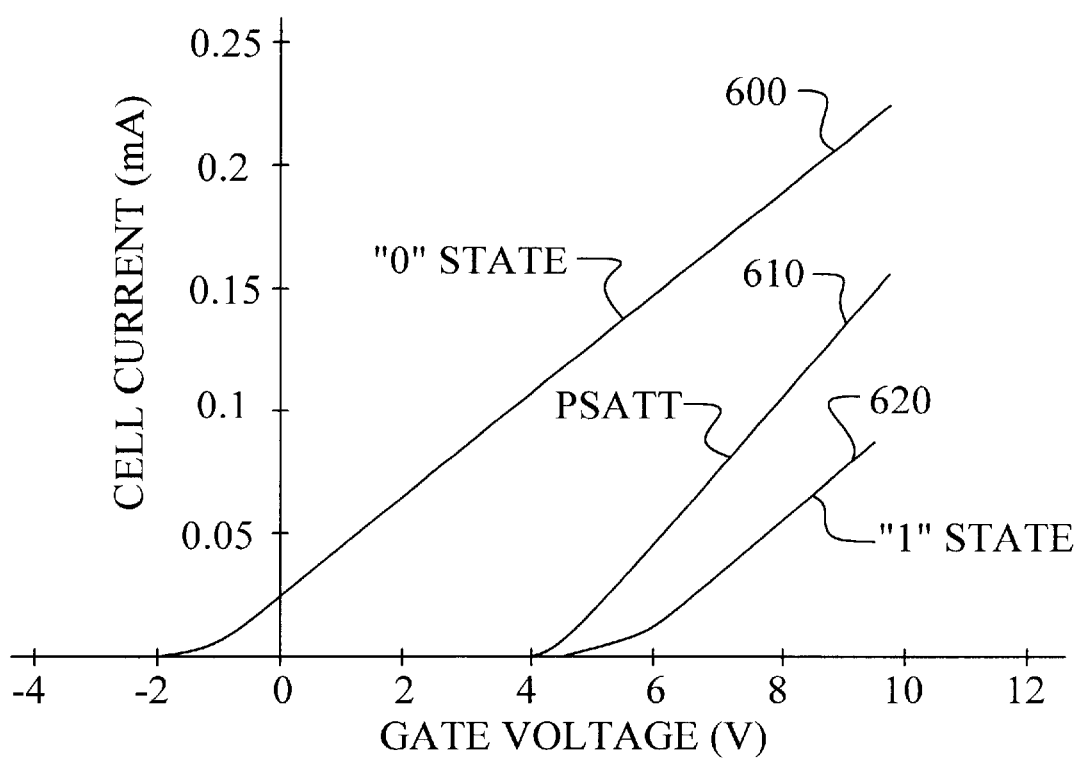
FIG. 25 illustrates graphically the cell current of the preferred embodiment of the PASTT Flash cell of the present invention.

Referring now to FIG. 25, the cell current of the PASTT Flash memory cell of the present invention is illustrated. The cell current is plotted against the gate voltage for the "0" state 600 and the "1" state 620. The large difference in threshold voltage for the "0" state cell and the programmed "1" state cell cause a large difference in turn ON voltages. The performance of the two PASTT devices on each cell is also plotted 610. The PASTT devices turn ON at about 4 Volts. Note that the presence of two PASTT devices per cell causes the greater slope or gain.

As shown in the preferred embodiments, the novel PASTT Flash memory device and method of manufacture achieved represents a performance improvement over prior art Flash cells. The novel approach improves voltage threshold control leading to reduced programming time and improved data retention. The PASTT Flash cell is particularly useful in multi-level applications.

While the invention has been particularly shown and described with reference to the preferred embodiments thereof, it will be understood by those skilled in the art that various changes in form and details may be made without departing from the spirit and scope of the invention.

What is claimed is:

1. A method to form a Flash memory device with Flash memory cells and parasitic surface transfer transistor (PASTT) devices in the manufacture of an integrated circuit device comprising:
    depositing a tunneling oxide layer overlying a semiconductor substrate;
    depositing a first conductive layer overlying said tunneling oxide layer;
    patterning said first conductive layer and said tunneling oxide layer to define the cell width edges of floating gates for planned Flash memory cells and to expose said semiconductor substrate where shallow trench isolations are planned;
    forming temporary sidewall spacers on said cell width edges of said first conductive layer;
    thereafter etching said exposed semiconductor substrate to form trenches for said planned shallow trench isolations;
    depositing a trench filling oxide layer overlying said first conductive layer and said temporary sidewall spacers and filling said trenches;
    polishing down said trench filling oxide layer to complete said shallow trench isolations and to thereby define active areas in said semiconductor substrate;
    removing said temporary sidewall spacers to thereby expose said active areas between said shallow trench isolations and said cell width edges of said first conductive layer wherein said exposed active areas form parasitic channels and unexposed said active areas form cell channels;
    thereafter ion implanting said semiconductor substrate to thereby adjust the threshold voltages of said Flash memory cells and of said PASTT devices;
    thereafter depositing an interlevel dielectric layer overlying said first conductive layer and said parasitic channels;
    depositing a second conductive layer overlying said interlevel dielectric layer wherein parasitic transistor gates are formed where said second conductive layer overlies said parasitic channels with said interlevel dielectric layer therebetween;
    patterning said second conductive layer, said interlevel dielectric layer, said first conductive layer, and said tunneling oxide to thereby form control gates and to define the cell length edges of said floating gates for said Flash memory cells wherein floating gates are formed where said first conductive layer overlies said cell channels with said tunneling oxide layer therebetween and wherein control gates are formed where said second conductive layer overlies said floating gates with said interlevel dielectric layer therebetween; and
    thereafter implanting ions into said semiconductor substrate to form source and drain junctions to complete said Flash memory cells and said PASTT devices in the manufacture of the Flash memory device.

2. The method according to claim 1 wherein said tunneling oxide layer comprises a thickness of between about 55 Angstroms and 120 Angstroms.

3. The method according to claim 1 wherein said first conductive layer comprises polysilicon.

4. The method according to claim 1 wherein said temporary sidewall spacers comprise silicon nitride.

5. The method according to claim 1 wherein said temporary sidewall spacers are formed to a width of between about 0.025 microns and 0.070 microns.

6. The method according to claim 1 wherein said step of polishing down comprises a chemical mechanical polish.

7. The method according to claim 1 wherein said step of ion implanting said semiconductor substrate to thereby adjust said threshold voltages of said Flash memory cells and of said PASTT comprises a dose of between about $1 \times 10^{10}$ atoms/cm$^2$ and $1 \times 10^{13}$ atoms/cm$^2$ and an energy of between about 5 KeV and 20 KeV.

8. The method according to claim 1 wherein said interlevel dielectric layer comprises a laminated stack (ONO) of silicon dioxide, silicon nitride, and silicon dioxide.

9. The method according to claim 1 wherein said second conductive layer comprises polysilicon.

10. The method according to claim 1 further comprising:
    implanting ions into said semiconductor substrate to form lightly doped regions after said step of patterning said second conductive layer, said interlevel dielectric layer, said first conductive layer, and said tunneling oxide to thereby form control gates and to define the cell length edges of said floating gates;

thereafter forming permanent sidewall spacers on said control gates and said floating gates.

11. The method according to claim 1 further comprising:

depositing a pad oxide layer overlying said first conductive layer after said step of depositing said first conductive layer; and depositing a silicon nitride layer overlying said pad oxide layer prior to said step of patterning said first conductive layer and said tunneling oxide layer to define said cell width edges of floating gates.

12. The method according to claim 11 wherein said silicon nitride layer acts as a polishing stop for said step of polishing down said trench filling oxide layer.

13. A method to form a Flash memory device with Flash memory cells and parasitic surface transfer transistors (PASTT) devices in the manufacture of an integrated circuit device comprising:

depositing a tunneling oxide layer overlying a semiconductor substrate;

depositing a first polysilicon layer overlying said tunneling oxide layer;

patterning said first polysilicon layer and said tunneling oxide layer to define the cell width edges of floating gates for planned Flash memory cells and to expose said semiconductor substrate where shallow trench isolations are planned;

forming temporary sidewall spacers on said cell width edges of said first polysilicon layer wherein said temporary sidewall spacers comprise silicon nitride;

thereafter etching said exposed semiconductor substrate to form trenches for said planned shallow trench isolations;

depositing a trench filling oxide layer overlying said first polysilicon layer and said temporary sidewall spacers and filling said trenches;

polishing down said trench filling oxide layer to complete said shallow trench isolations and to thereby define active areas in said semiconductor substrate;

removing said temporary sidewall spacers to thereby expose said active areas between said shallow trench isolations and said cell width edges of said first polysilicon layer wherein said exposed active areas form parasitic channels and unexposed said active areas form cell channels;

thereafter ion implanting said semiconductor substrate to thereby adjust the threshold voltages of said Flash memory cells and of said PASTT devices;

thereafter depositing an interlevel dielectric layer overlying said first polysilicon layer and said parasitic channels;

depositing a second polysilicon layer overlying said interlevel dielectric layer wherein parasitic transistor gates are formed where said second polysilicon layer overlies said parasitic channels with said interlevel dielectric layer therebetween;

patterning said second polysilicon layer, said interlevel dielectric layer, said first polysilicon layer, and said tunneling oxide to thereby form control gates and to define the cell length edges of said floating gates for said Flash memory cells wherein said floating gates are formed where said first polysilicon layer overlies said cell channels with said tunneling oxide layer therebetween and wherein said control gates are formed where said second polysilicon layer overlies said floating gates with said interlevel dielectric layer therebetween;

thereafter implanting ions into said semiconductor substrate to form lightly doped regions;

thereafter forming permanent sidewall spacers on said control gates and said floating gates; and thereafter implanting ions into said semiconductor substrate to form source and drain junctions to complete said Flash memory cells and said PASTT devices in the manufacture of the Flash memory device.

14. The method according to claim 13 wherein said tunneling oxide layer comprises a thickness of between about 55 Angstroms and 120 Angstroms.

15. The method according to claim 13 wherein said temporary sidewall spacers are formed to a width of between about 0.025 microns and 0.070 microns.

16. The method according to claim 13 wherein said step of polishing down comprises a chemical mechanical polish.

17. The method according to claim 13 wherein said step of ion implanting said semiconductor substrate to thereby adjust the threshold voltages of said Flash memory cells and said PASTT comprises a dose of between about $1 \times 10^{10}$ atoms/cm$^2$ and $1 \times 10^{13}$ atoms/cm$^2$ and an energy of between about 5 KeV and 20 KeV.

18. The method according to claim 13 wherein said interlevel dielectric layer comprises a laminated stack (ONO) of silicon dioxide, silicon nitride, and silicon dioxide.

19. The method according to claim 13 further comprising:

depositing a pad oxide layer overlying said first conductive layer after said step of depositing said first conductive layer; and depositing a silicon nitride layer overlying said pad oxide layer prior to said step of patterning said first conductive layer and said tunneling oxide layer to define said cell width edges of floating gates.

20. The method according to claim 19 wherein said silicon nitride layer acts as a polishing stop for said step of polishing down said trench filling oxide layer.

* * * * *